(12) United States Patent
Merrell et al.

(10) Patent No.: US 10,260,968 B2
(45) Date of Patent: Apr. 16, 2019

(54) POLYMERIC FOAM DEFORMATION GAUGE

(71) Applicant: NANO COMPOSITE PRODUCTS, INC., Orem, UT (US)

(72) Inventors: Aaron Jake Merrell, Orem, UT (US); Anton E. Bowden, Lindon, UT (US); David T. Fullwood, Provo, UT (US); Brian Anthony Mazzeo, Provo, UT (US)

(73) Assignee: Nano Composite Products, Inc., Orem, UT (US)

( * ) Notice: Subject to any disclaimer, the term of this patent is extended or adjusted under 35 U.S.C. 154(b) by 0 days.

(21) Appl. No.: 15/229,662

(22) Filed: Aug. 5, 2016

(65) Prior Publication Data

US 2016/0341610 A1 Nov. 24, 2016

Related U.S. Application Data

(63) Continuation-in-part of application No. 14/213,539, filed on Mar. 14, 2014.
(Continued)

(51) Int. Cl.
*G01L 5/00* (2006.01)
*G01L 1/06* (2006.01)
(Continued)

(52) U.S. Cl.
CPC .......... *G01L 1/04* (2013.01); *G01L 1/06* (2013.01); *G01L 1/16* (2013.01); *G01L 1/18* (2013.01);
(Continued)

(58) Field of Classification Search
None
See application file for complete search history.

(56) References Cited

U.S. PATENT DOCUMENTS

| | | |
|---|---|---|
| 3,321,592 A | 5/1967 | Miller |
| 3,748,373 A | 7/1973 | Remy |

(Continued)

FOREIGN PATENT DOCUMENTS

| | | |
|---|---|---|
| CN | 200994779 Y | 12/2007 |
| CN | 101219050 A | 7/2008 |

(Continued)

OTHER PUBLICATIONS

Wang, Zhong Lin. "Piezoelectric Nanogenerators for Self-Powered Nanosensors and Nanosystems." Wiley encyclopedia of electrical and electronics engineering (2012).*

(Continued)

*Primary Examiner* — Harshad R Patel
(74) *Attorney, Agent, or Firm* — Brake Hughes Bellerman LLP

(57) ABSTRACT

In one general aspect, an apparatus includes at least two conductive elements disposed in a polymeric foam and at least two voltage detectors. Each voltage detector is coupled to a respective conductive element and configured to detect a charge generated by an impact to the polymeric foam within a sensing radius of the respective conductive element. In another general aspect, an apparatus includes a deformation sensor and a voltage detector. The deformation sensor includes a conductive element disposed in a polymeric foam, a portion of the conductive element extending beyond an outer wall of the polymeric foam. The voltage detector is coupled to the portion of the conductive element and detects a charge generated by the deformation sensor responsive to an impact to the polymeric foam.

30 Claims, 24 Drawing Sheets

Related U.S. Application Data

(60) Provisional application No. 61/961,970, filed on Oct. 28, 2013, provisional application No. 61/960,489, filed on Sep. 19, 2013, provisional application No. 61/956,394, filed on Jun. 8, 2013, provisional application No. 61/789,730, filed on Mar. 15, 2013.

(51) Int. Cl.
  *G01L 1/04* (2006.01)
  *G01L 1/16* (2006.01)
  *G01L 1/18* (2006.01)
  *G01L 1/20* (2006.01)
  *H01L 41/37* (2013.01)
  *H01L 41/18* (2006.01)

(52) U.S. Cl.
  CPC .............. *G01L 1/20* (2013.01); *G01L 5/0052* (2013.01); *H01L 41/183* (2013.01); *H01L 41/37* (2013.01); *Y10T 29/49117* (2015.01)

(56) References Cited

U.S. PATENT DOCUMENTS

| | | | |
|---|---|---|---|
| 3,794,790 A | 2/1974 | Leyland | |
| 4,060,705 A | 11/1977 | Peachey | |
| 4,144,877 A | 3/1979 | Frei et al. | |
| 4,172,216 A | 10/1979 | O'Shea | |
| 4,258,100 A | 3/1981 | Fujitani et al. | |
| 4,624,796 A | 11/1986 | Giniewicz et al. | |
| 4,664,971 A | 5/1987 | Soens | |
| 4,762,970 A | 8/1988 | Brinsley | |
| 4,771,394 A | 9/1988 | Cavanagh | |
| 4,777,346 A | 10/1988 | Swanton | |
| 4,808,336 A | 2/1989 | Rubner et al. | |
| 4,951,985 A | 8/1990 | Pong et al. | |
| 5,060,527 A | 10/1991 | Burgess | |
| 5,132,583 A | 7/1992 | Chang | |
| 5,323,650 A | 6/1994 | Fullen et al. | |
| 5,373,651 A | 12/1994 | Wood | |
| 5,441,301 A | 8/1995 | Breed et al. | |
| 5,449,002 A | 9/1995 | Goldman | |
| 5,510,812 A | 4/1996 | O'Mara et al. | |
| 5,540,996 A | 7/1996 | Tanzilli et al. | |
| 5,568,659 A | 10/1996 | Fogel | |
| 5,592,759 A | 1/1997 | Cox | |
| 5,637,389 A | 6/1997 | Colvin et al. | |
| 5,695,859 A | 12/1997 | Burgess | |
| 5,702,629 A | 12/1997 | Cui et al. | |
| 5,775,715 A | 7/1998 | Vandergrift | |
| 5,856,644 A | 1/1999 | Burgess | |
| 5,951,908 A | 9/1999 | Cui et al. | |
| 6,033,370 A | 3/2000 | Reinbold et al. | |
| 6,121,869 A | 9/2000 | Burgess | |
| 6,126,874 A | 10/2000 | Dillon et al. | |
| 6,265,466 B1 | 7/2001 | Glatkowski et al. | |
| 6,360,597 B1 | 3/2002 | Hubbard et al. | |
| 6,430,843 B1 | 8/2002 | Potter et al. | |
| 6,485,432 B1 | 11/2002 | Stasz et al. | |
| 6,506,153 B1 | 1/2003 | Littek et al. | |
| 6,529,122 B1 | 3/2003 | Magnussen et al. | |
| 6,534,430 B2 | 3/2003 | Makino et al. | |
| 6,724,195 B2* | 4/2004 | Lurtz ..................... G01K 7/223 200/85 R | |
| 6,780,505 B1 | 8/2004 | Klett et al. | |
| 6,925,851 B2 | 8/2005 | Reinbold et al. | |
| 6,978,684 B2 | 12/2005 | Nurse | |
| 7,059,028 B2 | 6/2006 | Lammer | |
| 7,059,197 B2 | 6/2006 | Son et al. | |
| 7,147,214 B2 | 12/2006 | Klett et al. | |
| 7,225,565 B2 | 6/2007 | Dibenedetto et al. | |
| 7,426,873 B1 | 9/2008 | Kholwadwala et al. | |
| 7,443,082 B2 | 10/2008 | Grumm | |
| 7,479,878 B2* | 1/2009 | Maki ..................... G08B 13/124 340/552 | |
| 7,506,460 B2 | 3/2009 | Dibenedetto et al. | |
| 7,509,835 B2 | 3/2009 | Beck | |
| 7,587,937 B2 | 9/2009 | Haselhurst et al. | |
| 7,695,647 B2 | 4/2010 | Smela et al. | |
| 7,854,173 B2 | 12/2010 | Cheng et al. | |
| 7,935,415 B1 | 5/2011 | Hansen et al. | |
| 7,947,773 B2 | 5/2011 | Hansen et al. | |
| 7,997,125 B2 | 8/2011 | Kaya et al. | |
| 8,210,994 B2 | 7/2012 | Chang et al. | |
| 8,305,358 B2 | 11/2012 | Klinghult et al. | |
| 8,361,608 B1 | 1/2013 | Hansen et al. | |
| 8,371,174 B2 | 2/2013 | Chen et al. | |
| 8,544,337 B2 | 10/2013 | Kuczynski et al. | |
| 8,628,485 B2 | 1/2014 | Wilson et al. | |
| 8,631,703 B2 | 1/2014 | Nagai et al. | |
| 8,669,755 B2 | 3/2014 | Kato et al. | |
| 8,758,892 B2 | 6/2014 | Bergin et al. | |
| 8,904,877 B2 | 12/2014 | Burke et al. | |
| 8,984,954 B2 | 3/2015 | Merrell et al. | |
| 9,044,593 B2 | 6/2015 | Li et al. | |
| 2002/0198069 A1 | 12/2002 | Snyder et al. | |
| 2003/0009308 A1 | 1/2003 | Kirtley | |
| 2003/0213939 A1 | 11/2003 | Narayan et al. | |
| 2005/0044751 A1 | 3/2005 | Alaimo et al. | |
| 2005/0124864 A1 | 6/2005 | MacK et al. | |
| 2005/0174243 A1 | 8/2005 | Musil | |
| 2005/0258717 A1 | 11/2005 | Mullen | |
| 2006/0260058 A1 | 11/2006 | Schmidt | |
| 2006/0272429 A1 | 12/2006 | Ganapathi et al. | |
| 2007/0056081 A1 | 3/2007 | Aspray | |
| 2007/0068244 A1 | 3/2007 | Billing et al. | |
| 2007/0084293 A1 | 4/2007 | Kaiserman et al. | |
| 2007/0135878 A1 | 6/2007 | Lachenbruch et al. | |
| 2007/0157488 A1 | 7/2007 | Guzman | |
| 2008/0066564 A1 | 3/2008 | Hayakawa et al. | |
| 2008/0067618 A1 | 3/2008 | Wang et al. | |
| 2008/0067619 A1 | 3/2008 | Farahani et al. | |
| 2008/0277631 A1 | 11/2008 | Smela et al. | |
| 2009/0165569 A1 | 7/2009 | Taya et al. | |
| 2009/0226696 A1 | 9/2009 | Simpson | |
| 2009/0240171 A1 | 9/2009 | Bamberg et al. | |
| 2009/0288259 A1 | 11/2009 | Lean et al. | |
| 2009/0302714 A1 | 12/2009 | Kim | |
| 2010/0063779 A1 | 3/2010 | Schrock et al. | |
| 2010/0271174 A1 | 10/2010 | Kaminska et al. | |
| 2010/0305478 A1 | 12/2010 | Ordway et al. | |
| 2010/0324698 A1 | 12/2010 | Sverrisson et al. | |
| 2011/0054358 A1 | 3/2011 | Kim et al. | |
| 2011/0054359 A1 | 3/2011 | Sazonov et al. | |
| 2011/0192049 A1 | 8/2011 | Auger et al. | |
| 2011/0192564 A1 | 8/2011 | Mommer et al. | |
| 2011/0214501 A1 | 9/2011 | Ross et al. | |
| 2011/0226066 A1 | 9/2011 | Anand et al. | |
| 2011/0265973 A1 | 11/2011 | Scalia, Jr. | |
| 2012/0024061 A1 | 2/2012 | Chiang et al. | |
| 2012/0036939 A1 | 2/2012 | Jarjour et al. | |
| 2012/0048528 A1 | 3/2012 | Bergin et al. | |
| 2012/0055257 A1 | 3/2012 | Shaw-Klein | |
| 2012/0166091 A1 | 6/2012 | Kim et al. | |
| 2012/0193572 A1 | 8/2012 | Mackay | |
| 2012/0289866 A1 | 11/2012 | Irby et al. | |
| 2012/0291564 A1 | 11/2012 | Amos et al. | |
| 2013/0026411 A1 | 1/2013 | Jenninger et al. | |
| 2013/0074248 A1 | 3/2013 | Evans et al. | |
| 2013/0079693 A1 | 3/2013 | Ranky et al. | |
| 2013/0123665 A1 | 5/2013 | Mariani et al. | |
| 2013/0130843 A1 | 5/2013 | Burroughs et al. | |
| 2013/0224458 A1 | 8/2013 | Bolliou | |
| 2014/0013862 A1 | 1/2014 | Lind | |
| 2014/0039082 A1 | 2/2014 | Peterson et al. | |
| 2014/0182063 A1 | 7/2014 | Crawford et al. | |
| 2014/0183403 A1 | 7/2014 | Peterson et al. | |
| 2014/0230563 A1 | 8/2014 | Huang | |
| 2014/0260653 A1 | 9/2014 | Merrell et al. | |
| 2014/0338458 A1* | 11/2014 | Wang ..................... G01L 1/005 73/658 | |
| 2014/0350435 A1 | 11/2014 | Lam | |
| 2015/0182844 A1 | 7/2015 | Jang | |
| 2015/0283353 A1 | 10/2015 | Kohn et al. | |

(56) References Cited

U.S. PATENT DOCUMENTS

| | | | |
|---|---|---|---|
| 2016/0011091 A1 | 1/2016 | Huang et al. | |
| 2016/0163959 A1 | 6/2016 | Merrell et al. | |
| 2016/0166178 A1 | 6/2016 | Fuss et al. | |
| 2016/0181506 A1 | 6/2016 | Sirbuly et al. | |
| 2016/0192862 A1 | 7/2016 | Merrell et al. | |
| 2017/0077838 A1* | 3/2017 | Wang | H02N 1/04 |
| 2017/0303637 A1 | 10/2017 | Orand | |

FOREIGN PATENT DOCUMENTS

| | | |
|---|---|---|
| CN | 101669683 A | 3/2010 |
| CN | 201846875 U | 6/2011 |
| CN | 102144056 A | 8/2011 |
| CN | 102175356 A | 9/2011 |
| CN | 202396563 U | 8/2012 |
| CN | 202635729 U | 1/2013 |
| CN | 103110235 A | 5/2013 |
| CN | 103142236 A | 6/2013 |
| CN | 103900741 A | 7/2014 |
| CN | 104138658 A | 11/2014 |
| CN | 203914881 U | 11/2014 |
| CN | 203934734 U | 11/2014 |
| CN | 204117311 U | 1/2015 |
| CN | 204582326 U | 8/2015 |
| EP | 522882 A2 | 1/1993 |
| EP | 0700270 A1 | 3/1996 |
| EP | 1265825 A2 | 12/2002 |
| EP | 2277691 A1 | 1/2011 |
| EP | 2330937 A2 | 6/2011 |
| EP | 2078477 B1 | 7/2011 |
| EP | 2523231 A1 | 11/2012 |
| EP | 2608287 A1 | 6/2013 |
| EP | 2848139 A1 | 3/2015 |
| EP | 2973766 A1 | 1/2016 |
| JP | S5318893 B2 | 6/1978 |
| JP | 05296861 A | 11/1993 |
| JP | 2002047370 A | 2/2002 |
| JP | 2002340700 A | 11/2002 |
| JP | 2002357487 A | 12/2002 |
| JP | 2003282983 A | 10/2003 |
| JP | 2006084354 A | 3/2006 |
| JP | 2006528366 A | 12/2006 |
| JP | 3968430 B2 | 8/2007 |
| JP | 2007533109 A | 11/2007 |
| JP | 4063564 B2 | 3/2008 |
| JP | 2008542691 A | 11/2008 |
| JP | 2008544218 A | 12/2008 |
| JP | 2009139329 A | 6/2009 |
| JP | 4565109 B2 | 10/2010 |
| JP | 2012164735 A | 8/2012 |
| JP | 5198608 B2 | 5/2013 |
| JP | 5981852 B2 | 8/2016 |
| KR | 1020100122002 A | 11/2010 |
| KR | 1020120099938 A | 9/2012 |
| WO | 8910166 A1 | 11/1989 |
| WO | 98/29851 A1 | 7/1998 |
| WO | 9829851 A1 | 7/1998 |
| WO | 0013582 A1 | 3/2000 |
| WO | 2004070336 A1 | 8/2004 |
| WO | 2005117030 A9 | 1/2006 |
| WO | 2006132463 A1 | 12/2006 |
| WO | 2009089406 A2 | 7/2009 |
| WO | 2009108334 A2 | 9/2009 |
| WO | 2010091258 A1 | 8/2010 |
| WO | 2010096691 A2 | 8/2010 |
| WO | 2010131820 A1 | 11/2010 |
| WO | 2011083611 A1 | 7/2011 |
| WO | 2012007855 A1 | 1/2012 |
| WO | 2012035350 A1 | 3/2012 |
| WO | 2012098840 A1 | 7/2012 |
| WO | 2013120398 A1 | 8/2013 |
| WO | 2014008250 A1 | 1/2014 |
| WO | 2014080429 A1 | 5/2014 |
| WO | 2015003211 A1 | 1/2015 |

OTHER PUBLICATIONS

Gerhard-Multhaupt, Reimund. "Less can be more. Holes in polymers lead to a new paradigm of piezoelectric materials for electret transducers." IEEE Transactions on Dielectrics and Electrical Insulation 9.5 (2002): 850-859.*

Taghavi, Majid, et al. "A Novel Soft Metal-Polymer Composite for Multidirectional Pressure Energy Harvesting." Advanced Energy Materials 4.12 (2014).*

S. Bauer, "Piezo-, pyro- and ferroelectrets: soft transducer materials for electromechanical energy conversion," in IEEE Transactions on Dielectrics and Electrical Insulation, vol. 13, No. 5, pp. 953-962, Oct. 2006.*

Zeng et al., "Synthesis and processing of PMMA carbon nanotube nanocomposite foams", Polymer 51.3, (2010), pp. 655-664.

Yao et al., "Wearable multifunctional sensors using printed stretchable conductors made of silver nanowires", Nanoscale, The Royal Society of Chemistry, Dec. 5, 2013, 8 pages.

Alonso et al., "Short-fiber-reinforced epoxy foams", Composites Part A: Applied Science and Manufacturing, vol. 37, No. 11, 2006, pp. 1952-1960.

Bonato, Paolo, "Wearable Sensors/Systems and Their Impact on Biomedical Engineering", IEEE Engineering In Medicine and Biology Magazine, May/Jun. 2003, pp. 18-20.

Brady et al., "Inherently conducting polymer modified polyurethane smart foam for pressure sensing", Sensors and Actuators A: Physical 119.2, (2005), pp. 398-404.

Calkins et al., "Applications for a Nano-Composite High Displacement Strain Gauge", 2010, 9 pages.

Calkins, Thomas, "Nanocomposite High Displacement Strain Gauges for use in Human-Machine Interfaces: Applications in Hand Pose Determination", available at http://scholarsarchive.byu.edu/cgi/viewcontent.cgi?article=3626&context=etd, 2011, 97 pages.

Cannata et al., "An Embedded Artificial Skin for Humanoid Robots", Proceedings of IEEE International Conference on Multisensor Fusion and Integration for Intelligent Systems Seoul, Korea, Aug. 2008, pp. 434-438.

Challagulla et al., "Electromechanical response of piezoelectric foams", Acta Materialia, vol. 60, No. 5, Mar. 2012, pp. 2111-2127.

Chen et al., "Polymer nanocomposite foams", Journal of Materials Chemistry A 1.12 (Published online Dec. 18, 2012), pp. 3837-3850.

Cheung et al., "A novel fluidic strain sensor for large strain measurement", Sensors and Actuators A 147, (2008), pp. 401-408.

Converse et al., "Quantification of Nickel Nanstrand Distributions within a Silicone Matrix using a FIB/SEM System", International SAMPE Technical Conference, 2010, 15 pages.

Dai et al., "Electrical properties of an ultralight conductive carbon nanotube/polymer composite foam upon compression," Polymer-Plastics Technology and Engineering, 51.3, 2012, pp. 304-306.

Flandin et al., "Effect of Strain on the Properties of an Ethylene—Octene Elastomer with Conductive Carbon Fillers", Journal of Applied Polymer Science, vol. 76, 2000, pp. 894-905.

Fleming et al., "In Vivo Measurement of Ligament/Tendon Strains and Forces: A Review", Annals of Biomedical Engineering, vol. 32, No. 3, Mar. 2004, pp. 318-328.

Fullwood et al., "Dispersion metrics for composites—a machine learning based analysis", SAMPE International, Long Beach, CA, (2013), 12 pages.

Hampshire et al., "Monitoring the behavior of steel structures using distributed optical fiber sensors", Journal of Constructional Steel Research 53, (2000), pp. 267-281.

Hyatt et al., "Nano-composite Sensors for Wide Range Measurement of Ligament Strain", Proceedings of the SEM Annual Conference, Society of Experimental Mechanics Inc., Jun. 2010, 4 pages.

Ibeh et al., "Current Trends in Nanocomposite Foams", Journal of Cellular Plastics 44.6, (2008), pp. 493-515.

Johnson et al., "A Percolation/Quantum Tunneling Model for the Unique Behavior of Multifunctional Silicon/Nickel Nanostrand Nanocomposites", Society for the Advancement of Material and Process Engineering, 2010, 10 pages.

(56) References Cited

OTHER PUBLICATIONS

Johnson et al., "Multiscale Model for the Extreme Piezoresistivity in Silicon/Nickel Nanostrand Nanocomposites", Metallurgical and Materials, Transactions A, 2011, 11 pages.
Johnson et al., "Nanocomposite Large-Strain Sensor Optimization", 2009, 1 page.
Johnson et al., "Optimization of nickel nanocomposite for large strain sensing applications", Sensors and Actuators A 166, (2011), pp. 40-47.
Johnson et al., "The Colossal Piezoresistive Effect in Nickel Nanostrand Polymer Composites and a Quantum Tunneling Model", Tech Science Press, CMC, vol. 15, No. 2, 2010, pp. 87-111.
Kanda, Masae , "High Strain Electrostrictive Polymers: Elaboration Methods and Modelization", URL:https://tel.archives-ouvertes.fr/tel-00701539/document, May 25, 2012, 164 pages.
Koecher et al., "Characterization of Nickel Nanostrand Nanocomposites Through Dielectric Spectroscopy and Nanoindentation", Polymer Engineering & Science, Apr. 2, 2013, pp. 2666-2673.
Linder et al., "Dielectric barrier microdischarges: Mechanism for the charging of cellular piezoelectric polymers", Journal of Applied Physics , vol. 91, No. 8, Apr. 15, 2002, pp. 5283-5287.
Ma et al., "The Effect of Surface Chemistry of Graphene on Cellular Structures and Electrical Properties of Polycarbonate Nanocomposite Foams", Industrial & Engineering Chemistry Research 53.12, (2014), pp. 4697-4703.
Mahfuz et al., "Fabrication, synthesis and mechanical characterization of nanoparticles infused polyurethane foams", Composites Part A: Applied Science and Manufacturing, vol. 35, No. 4, 2004, pp. 453-460.
Merrell et al., "Applications of nano-composite piezoelectric foam sensors", Proceedings of ASME conference on Smart Materials, SMASIS, Salt Lake City, Sep. 16-18, 2013, 5 pages.
Neugschwandtner et al., "Large and broadband piezoelectricity in smart polymer-foam space-charge electrets", Applied Physics Letters , vol. 77, No. 23, Dec. 4, 2000, pp. 3827-3829.
Patel, Imran, "Ceramic Based Intelligent Piezoelectric Energy Harvesting Device", Ch. 8 of the book "Advances in Ceramics—Electric and Magnetic Ceramics, Bioceramics, Ceramics and Environment" published on Sep. 6, 2011, pp. 133-154.
Patel et al., "Longitudinal Monitoring of Patients with Parkinson's Disease via Wearable Sensor Technology in the Home Setting", 33rd Annual International Conference of the IEEE EMBS Boston, Massachusetts USA, Aug. 30-Sep. 3, 2011, pp. 1552-1555.
Remington et al., "Biomechanical applications of quantum nanocomposite strain gauges", SAMPE International, Long Beach, CA, (2013), pp. 1-4.
Rizvi et al., "Characterization of a Porous Multifunctional Nanocomposite for Pressure Sensing", ASME 2012 Conference on Smart Materials, Adaptive Structures and Intelligent Systems, American Society of Mechanical Engineers, Abstract, 2012, 1 page.
Saha et al., "Effect of nanoparticles on mode-I fracture Toughness of Polyurethane Foams", Polymer Composites, vol. 30, No. 8, 2009, pp. 1058-1064.
Shen et al., "Mechanical characterization of short fiber reinforced phenolic foam", Composites Part A: Applied Science and Manufacturing, vol. 34, No. 9, 2003, pp. 899-906.
Sun, et al., "Energy absorption capability of nanocomposites: A review", Composites Science and Technology, vol. 69, No. 14, 2009, pp. 2392-2409.
Tao et al., "Gait Analysis Using Wearable Sensors", Sensors 2012, 12, 2012, pp. 2255-2283.
Ventrelli, L., et al., "Development of a stretchable skin-like tactile sensor based on polymeric composites", Proceedings of the 2009 IEEE International Conference on Robotics and Biomimetics, Dec. 19-23, 2009, pp. 123-128.
Verdejo et al., "Enhanced acoustic damping in flexible polyurethane foams filled with carbon nanotubes", Composites Science and Technology 69.10, (2009), pp. 1564-1569.
Verdejo et al., "Physical properties of silicone foams filled with carbon nanotubes and functionalized graphene sheets", European Polymer Journal 44.9, (2008), pp. 2790-2797.
Watanabe et al., "Tests of Wireless Wearable Sensor System in Joint Angle Measurement of Lower Limbs", 33rd Annual International Conference of the IEEE EMBS Boston, Massachusetts USA, Aug. 30-Sep. 3, 2011, pp. 5469-5472.
Wegener, M., "Piezoelectric polymer foams: Transducer mechanism and preparation as well as touch-sensor and ultrasonic-transducer properties", Proceedings of SPIE, vol. 76441A-1, 2010, pp. 1-9.
Yan et al., "Electrical Conductivity and Major Mechanical and Thermal Properties of Carbon Nanotube-Filled Polyurethane Foams", Journal of Applied Polymer Science 120.5, (2011), pp. 3014-3019.
Yang et al., "Conductive Carbon Nanofiber-Polymer Foam Structures", Advanced Materials 17.16, (2005), pp. 1999-2003.
Han et al.; "Thermal Conductivity of Carbon Nanotubes and Their Polymer Nanocomposites: A Review"; Progress in Polymer Science 36 (2011); pp. 914-944.
Notice of Allowance for Japanese Application No. 2017-093823, dated Mar. 13, 2018, 3 pages.
Office Action with English Translation for Russian Application No. 2015143715, dated Feb. 16, 2018, 12 pages.

\* cited by examiner

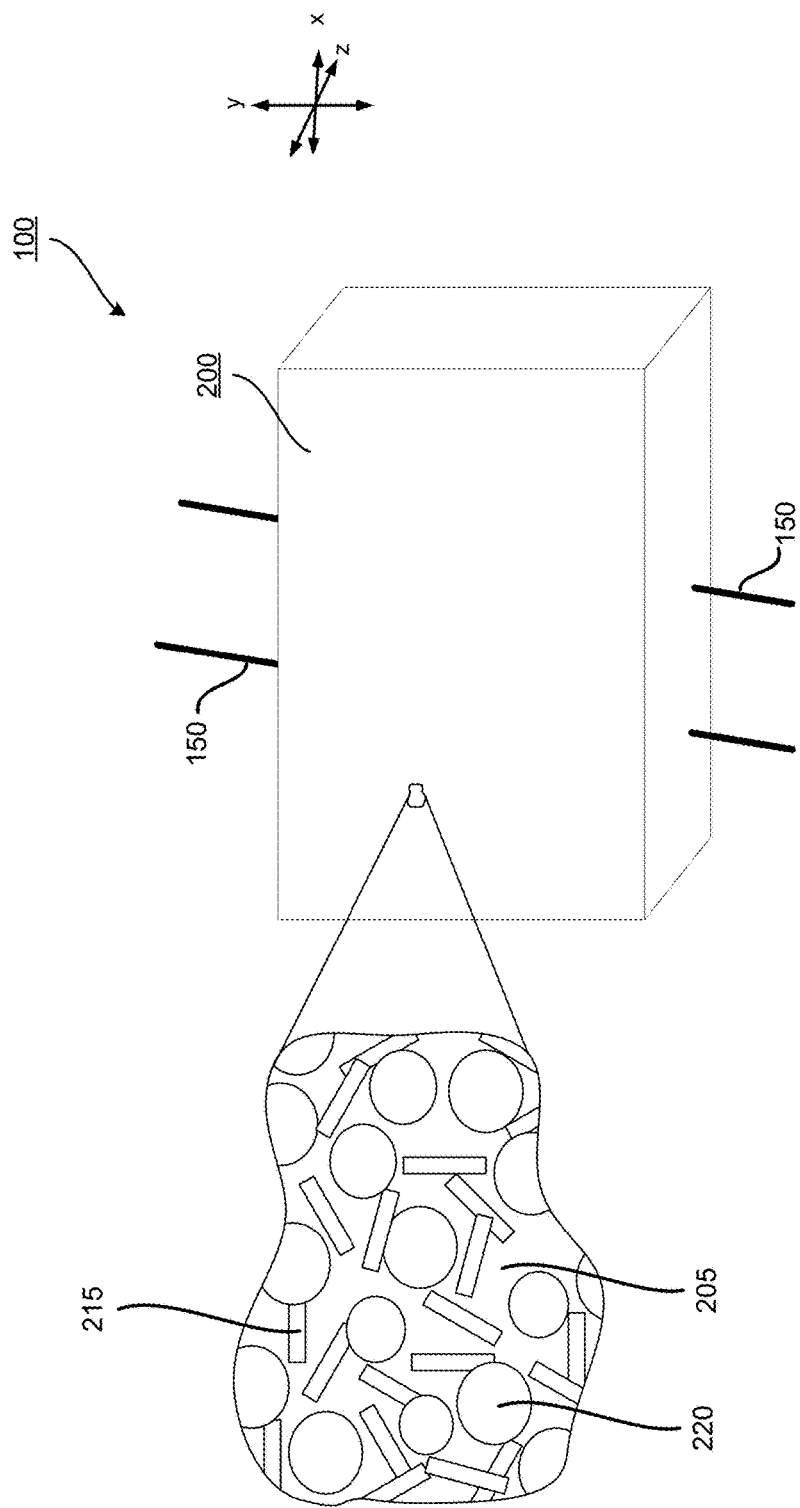

POLYMERIC FOAM DEFORMATION GAUGE

CROSS REFERENCE TO RELATED APPLICATIONS

This application is a continuation-in-part of, and claims priority to, U.S. application Ser. No. 14/213,539, filed Mar. 14, 2014, which is a non-provisional of, and claims priority to, U.S. Provisional Application No. 61/789,730, filed on Mar. 15, 2013, U.S. Provisional Application No. 61/956,394, filed on Jun. 8, 2013, U.S. Provisional Application No. 61/960,489, filed on Sep. 19, 2013, and U.S. Provisional Application No. 61/961,970, filed Oct. 28, 2013, which are all incorporated by reference herein in their entirety.

FEDERALLY SPONSORED RESEARCH

This application was made with support from a government grant under Grant Number CMMI-1235365 awarded by the National Science Foundation. The government has certain rights in this application.

TECHNICAL FIELD

This description relates to measuring strain and/or deformation using a uniform composite material that conducts and generates charge in response to deformation and relaxation under both dynamic and quasi-static loading conditions.

BACKGROUND

Strain, impact energy, and force sensors can provide vital information for many mechanics and dynamics applications. In a general sense these sensors can be thought of as responding to applied deformation (either quasi-static or dynamic); hence they will be discussed under the generic term of 'deformation gauges'. Some deformation gauges are piezoresistive, meaning that the electrical conductivity of the gauge changes after deformation. Such gauges require a current or voltage source to operate, such as a battery. Other deformation gauges are piezoelectric, meaning that the gauge generates electric potential due to deformation in the form of a voltage or current that can be measured. Traditional strain gauges (such as metal foil gauges) are often limited in terms of the magnitude of strain they can measure, generally limited to strain ranges of 1-5% strain. Additionally, many such gauges are expensive and difficult to calibrate, limiting the use of such gauges to a laboratory setting.

SUMMARY

A polymeric foam is provided that can be used as a deformation gauge measuring mechanical characteristics of impact and deformation via a charge generated by the composite foam gauge. In addition, the deformation gauge may conduct the charge generated so it can be measured. The deformation gauge may be a polymeric foam with conductive elements, e.g., wires, conductive metal coated film, conductive fabric, etc. The conductive elements may be disposed in the polymeric foam (neat or composite) or disposed on an outer wall of a composite polymeric foam. In some implementations, the deformation gauge may be a composite material that includes a uniform composite polymeric foam having conductive fillers dispersed throughout. Such implementations may increase the electric potential (i.e., the voltage) produced due to deformation. In some implementations, the polymeric foam may lack such conductive fillers and is considered a neat foam. The deformation gauge, or in other words, the polymeric foam with conductive elements, provides unexpected phenomena, namely a generation of a charge in response to deformation, which can be used in sensing applications. In addition, the conductive elements that generate the charge may function as transporters of the charge. Thus, for example, the conductive elements may function as probes that conduct the charge to a voltage detection device (or devices). A primary differentiator of the present polymeric deformation gauge is that it exhibits a predictable and repeatable generation of charge at mechanical strains of up to 80% or more. Some compositions of the polymeric deformation gauge do not suffer from drift. Because the polymeric deformation gauge possesses mechanical properties similar to many commercial foams, the polymeric deformation gauge can be substituted or embedded into existing commercial products without significantly changing the footprint of the product or the mechanical response properties of the product. Such a substitution or embedment adds sensing capabilities to existing products. Moreover, the deformation gauge can easily be mass produced in continuous processes or batch processes. This differs from conventional triboelectric sensing devices, which have a complex, cumbersome manufacturing process that often requires a cleanroom.

In one general aspect, an apparatus includes a deformation sensor and a voltage detector. The deformation sensor includes a conductive elements disposed in a polymeric foam, a portion of the conductive element extending beyond an outer wall of the polymeric foam. The voltage detector is coupled to the portion of the conductive element that extends beyond the outer wall and detects a charge generated by the deformation sensor responsive to an impact to the polymeric foam.

In another aspect, an apparatus includes at least two conductive elements disposed in a polymeric foam and at least two voltage detectors. Each voltage detector is coupled to a respective conductive element and configured to detect a charge generated by an impact to the polymeric foam within a sensing radius of the respective conductive element.

In another aspect, a method for measuring compression strain includes detecting, along a first axis, a charge generated in response to an impact to a polymeric foam having at least one conductive element disposed therein, the impact being along a second axis different from the first axis and determining a deformation of the impact based on the charge.

In another aspect, a method of making a deformation sensor includes attaching a conductive element on a substrate, casting an uncured polymeric foam on the conductive element, and curing the polymeric foam to form the deformation sensor, the deformation sensor producing a voltage in response to compression. In some implementations, the substrate may be a film or fabric or a second cured foam.

In another aspect a method of making a deformation sensor includes casting an uncured polymeric foam on a continuous casting system to a size larger than the final product, cutting the foam to the desired size, disposing a conductive element on an outside surface of the cured polymeric foam, and connecting the conductive element to a voltage detector.

The details of one or more implementations are set forth in the accompanying drawings and the description below. Other features will be apparent from the description and drawings, and from the claims.

BRIEF DESCRIPTION OF THE DRAWINGS

FIGS. 2A through 2C are high-level schematic diagram of a deformation gauge that includes a uniform composite polymeric foam that enhances the charge generated in response to deformation, according to implementations.

DETAILED DESCRIPTION

In one general aspect, a deformation gauge includes polymeric foam with conductive elements disposed therein, the polymeric foam and conductive elements functioning as a deformation gauge. The polymeric deformation gauge uses a triboelectric effect to induce charge displacement at the interface of two dissimilar materials and to conduct that charge from that surface through conductive elements to be sensed or used in a generative fashion for attached electronics. The apparatus harvests charge generated by the triboelectric effect through the use of in-place conductive elements (e.g., charge generating/collecting structures, such as wires, fibers, films, conductive fabric, conductive ink or paint, etc.), in a polymeric foam. In some implementations, the foam may be a uniform composite material including a plurality of conductive nanoparticles disposed in a polymeric foam base. Implementations do not require clean room fabrication, making manufacture of sensing devices that include the deformation gauge simpler and less expensive to produce. The amount of electric charge generated by a deformation event may be predicted by the surface area of the conductive elements disposed in the foam. For example, increasing the number of wires disposed in the polymeric foam, increasing the surface area of the wires (e.g., by adding micro texture or diameter), or coiling the wire, increases the surface area and thereby increases the voltage produced in a predictable manner. Controlling the electric charge generated enables a manufacturer to maximize the voltage output and minimize cost for the needs of the manufacturer. Moreover, a manufacturer may target a specific electric charge generated to power another device.

Figure 1A:
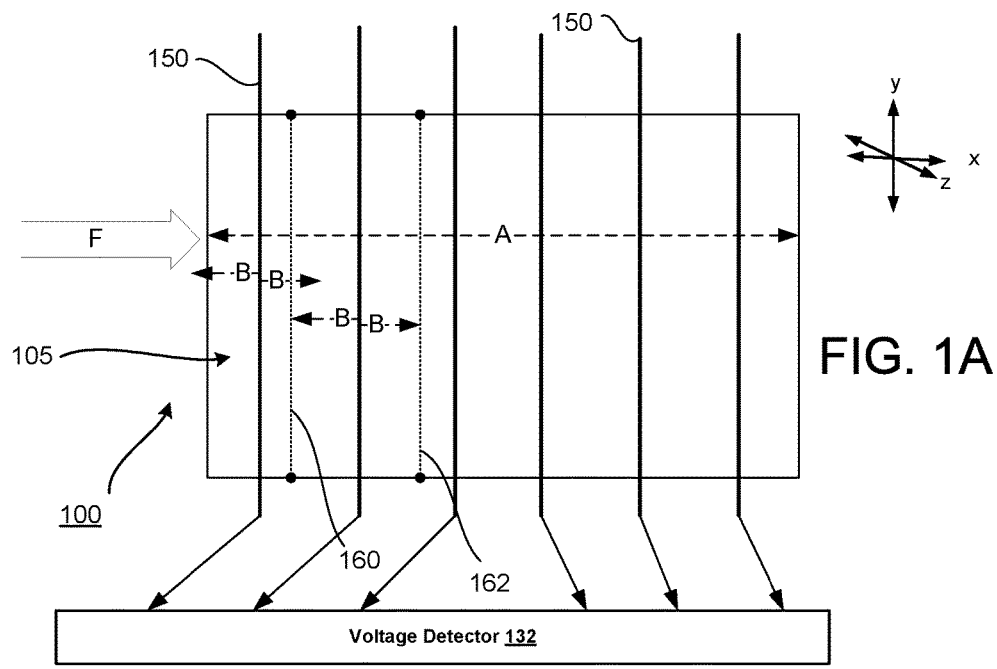
FIGS. 1A to 1C are schematic diagrams of example polymeric deformation gauges with conductive elements that generates as well as conducts charge, according to an implementation.

FIG. 1A is a schematic diagram of a polymeric deformation gauge, according to an implementation. The deformation gauge of FIG. 1A includes polymeric foam 105. The polymeric foam 105 may be any polymeric foam, such as an elastomeric polymer foam, a silicone-based foam, a polyurethane foam, a thermoset foam, or other foam-like material. The polymeric foam 105 may or may not retain its shape after deformation. For example, the polymeric foam 105 may be capable of experiencing substantial deformations while substantially retaining its shape, depending upon the mechanical constitutive behavior of the polymeric foam/conductive filler composite. Some foams may retain their shape following strains up to and exceeding 90% strain, other foams may become permanently deformed with strains as low as 1%. In other words, the polymeric foam 105 has elasticity, porosity, and high failure strain, typically from 50% to 1000% strain. In some implementations, the polymeric foam 105 may be a composite material that includes conductive fillers, as discussed in more detail with regards to FIGS. 2A-2E.

The deformation gauge 100 of FIG. 1A also includes conductive elements 150 disposed in the polymeric foam 105. The conductive elements 150 are macroscopic, or in other words visible to the human eye, and made of a material that conducts electricity. The conductive elements 150 may be thus be wires, straight, coiled, braided, or splayed, or wires with a mesh screen attached to increase surface area. In some implementations, the wires may be plated wire (e.g., tinned copper wire). The conductive elements 150 may also be conductively coated fibers that are straight, coiled, braided, or splayed. The conductive elements 150 can also be metallic coated films, sheets, or fabric that can be shaped in order to increase or decrease a material property of the foam 105 (i.e., increase stiffness in one direction). A desired characteristic of the deformation gauge may determine the configuration of the conductive elements 150. For example smaller diameter wires may be less likely to fatigue and break due to bending. As another example, braided thin wires may have better flexural characteristics than single thick wires. The conductive elements 150 may be placed in the foam 105 prior to casting or inserted into the foam after casting. In some implementations, the conductive elements 150 may be inserted as part of or during the curing process. In some implementations, the conductive elements 150 may be inserted after the foam 105 has cured. The inclusion of the conductive elements 150 foam creates a mechanical and conductive and triboelectric interface between the polymeric foam 105 and the conductive element 150. For example the polymeric foam 105 can be a polyurethane foam with a triboelectric affinity of +60 nC/J and tend to charge positively when rubbed against a conductive element, such as copper wire. In this example, the foam-wire interaction creates a migration of charge when impacted. This migration can be estimated by the surface area of conductive material that is in contact with the polymeric foam, in this example polyurethane (+60 nC/J) and nickel (0 nC/J), and the amount of motion between the materials that occurs during the compression. The migration increases as the impact energy increases and as the difference in triboelectric affinity increases. In some implementations, the minimum difference in triboelectric affinity is 60 nC/J.

The migration of charge in response to impact (in the form of peak voltage) can be predicted as a function of surface area x; for example, in one implementation, the following model was found to predict the resultant charge: $Q(x)=a^{b*x}+c^{d*x}$, where a, b, c, and d are coefficients. Table 1 lists the coefficients with 95% confidence bounds where peak voltage is predicted as a function of conductive surface area.

TABLE 1

| Coefficient | Estimate | Upper Bound | Lower Bound |
|---|---|---|---|
| a | 0.854 | 0.8425 | 0.8655 |
| b | 0.00164 | 0.001535 | 0.001746 |
| c | −0.8376 | −0.8505 | −0.8246 |
| d | −0.04459 | −0.04602 | −0.04316 |

Not only does the combination of the polymeric foam 105 and the conductive elements 150 produce a charge in response to deformation, the conductive elements 150 themselves may serve as probes for sensing the resulting voltage. For example, the portion of a conductive element 150 that extends beyond the outer wall of the polymeric foam 105 may be operably coupled to a voltage detector 132. Voltage detector 132 may be an example of voltage detector 432 of FIG. 4 and, as such, may represent one or more voltage detectors. The conductive elements 150 may be used, when operably coupled to the one or more voltage detectors 132, to detect a voltage response to an impact or deformation, labeled as "F" in FIG. 1A. As illustrated in FIG. 1A, the impact F may be along a first axis A. The impact F may cause the deformation gauge 100 to produce a charge, in the form of a voltage increase, that may be detected using one or more of conductive elements 150. The conductive elements 150 may detect the charge along any axis. In other words, the conductive elements 150 may generate and conduct a charge independent from the axis of the impact F.

Each conductive element 150 may detect and conduct charge generated within a radius of the conductive element 150. For example, in FIG. 1A the conductive elements 150 may detect charge generated within a radius B, also called a sensing radius, of the conductive element 150. In other words, a deformation or an impact F that occurs anywhere within the radius B of the conductive element (represented by the two dotted lines 160 and 162) may be detected and conducted by the conductive element 150. In some implementations, the configuration of the conductive elements 150 within the polymeric foam 105 may be determined by the size of the radius B. For example, the conductive elements 150 may be adjacently spaced so that the sensing radii of such conductive elements 150 overlap. Conductive elements that are adjacently spaced do not touch. As one example, the space between the adjacent conductive elements may be at least the size of the sensing radius but less than twice the size of the sensing radius. Thus, an impact F occurring anywhere along the outer wall of the polymeric foam may generate a charge that is conducted by at least one of the conductive elements 150. A conductive element 150 may fail to generate and conduct a charge from an impact that occurs outside the radius B from that conductive element. The size of the radius B may depend on the properties of the conductive element 150 and the properties of the polymeric foam 105. For example, where the polymeric foam 105 is a composite material that includes conductive fillers, the radius B may be larger and, therefore, fewer conductive fillers may be needed to sense the charge generated from an impact. In general, as the conductivity of the polymeric foam 105 increases (e.g., due to inclusion of conductive fillers), the radius B becomes larger. In some implementations the conductive elements are placed so that any impact of the foam produces a response that is measureable in at least one element.

The geometry of the polymeric foam 105 may also affect the radius B in which the conductive elements can detect the charge. For example if the polymeric foam 105 is very thin, ¼" or less, the charge will not propagate as far as it would if the polymeric foam 105 were thicker. This can also be used as a method to determine location of deformation or impact. When the polymeric foam 105 does not include conductive fillers the polymeric foam 105 is referred to as a neat foam. When the polymeric foam 105 includes conductive fillers, the polymeric foam 105 is referred to as a composite foam. In a neat foam the surface area of the conductive elements may determine the amount of charge generated in response to deformation. In a composite foam, the surface area of the conductive elements is less important than the presence of the conductive elements.

Figure 1B:
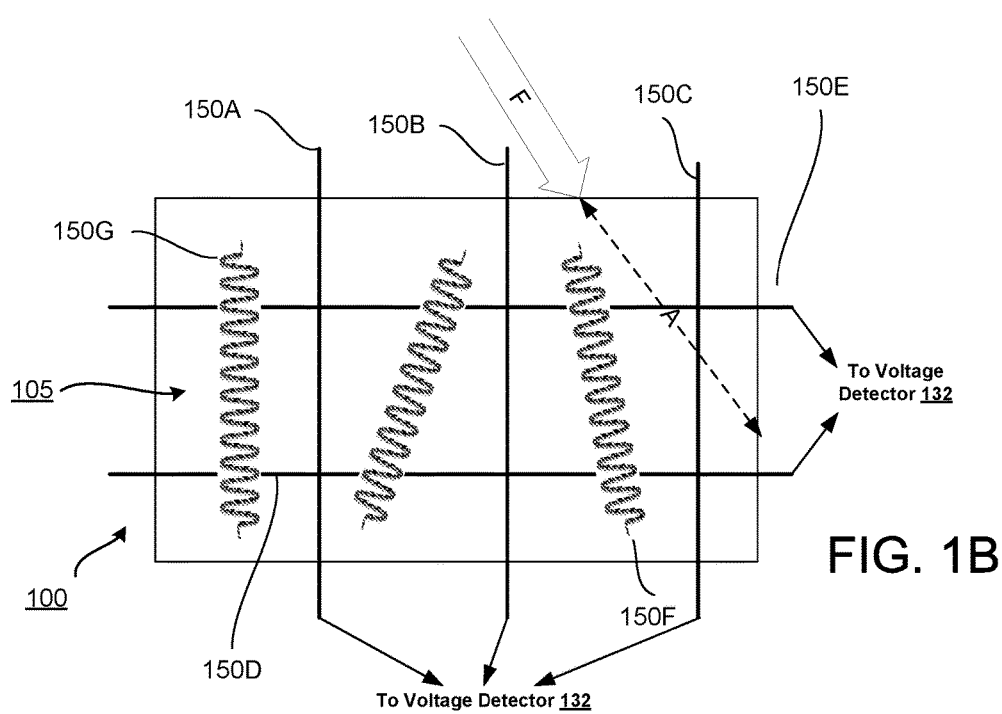

In some implementations, only a subset of the conductive elements 150 may function as probes. For example, some conductive elements 150 may be included to increase the surface area of the conductive element within the polymeric foam and, therefore, increase the charge generated from an impact. Such conductive elements may not be coupled to a voltage detector. FIG. 1B illustrates an example of a polymeric foam with a subset of the conductive elements 150 that function as probes. For example, in the example of FIG. 1B, conductive elements 150A, 150B, 150C, 150D, and 150E extend beyond the outer wall of the polymeric foam 105 and may be coupled with a voltage detector. Conductive elements 150F and 150G do not extend beyond the outer wall and may be present to increase the surface area of the conductive elements, thereby increasing the charge generated during an impact event. FIG. 1B also illustrates that the conductive elements 150 need not be straight, but can be any shape, including folded, coiled, splayed, mesh, etc. For example, a wire may enter the outer wall of the polymeric foam and then be splayed within the foam, which increases the surface area of the conductive elements. Thus, the conductive elements need not run from outer wall to outer wall. FIG. 1B also illustrates that the conductive elements are able to detect current generated from impact F independent of the axis A of the impact.

As illustrated in FIGS. 1A and 1B, the deformation gauge 100 produces a voltage detectable along an axis that differs from the axis A associated with the impact F. Thus, FIGS. 1A and 1B illustrate that detecting the generated charge in the deformation gauge 100 is independent of the direction (or axis) of the impact. FIG. 1B further illustrates that the conductive elements 150 need not be along a horizontal or vertical axis. Instead, a conductive elements 150 may generate and conduct a charge from an impact F anywhere within the radius B for that conductive element. Put another way, the deformation gauge 100, does not exhibit a preferred directionality. For example, the deformation gauge 100 may generate charge along the x-axis, the y-axis, and the z-axis, which are illustrated in FIG. 1A. In other words, the deformation gauge 100 may generate charge detectable from one outer surface of the material to another outer surface, regardless of which outer surfaces are used. Moreover, the deformation gauge 100, once the polymeric foam is cured with the conductive elements 150 disposed therein (whether disposed before curing, during curing, or after curing), does not need to be charged; the generation of charge in response to impact is inherent in the deformation gauge 100 itself.

One or more of the conductive elements 150 may extend beyond the outer wall of the polymeric foam 105 and one or more of the conductive elements 150 may also be disposed or inserted into the interior of the deformation gauge 100. In some implementations, one or more of the conductive elements 150 may extend beyond the outer wall on one side but not an opposite side of the polymeric foam 105. The placement of the conductive elements 150 in the polymeric foam 105 can be irregular (e.g. need not be orthogonal or evenly spaced) and may have a random arrangement. In addition, conductive elements 150 closer to the impact site, for example probe 150B, may measure a higher voltage than probes further from the impact site, for example probe 150C. Although the differences may be slight, they can be used to approximate where at the outer-wall of the deformation gauge 100 the impact occurred, e.g., by a compression impact analysis module, such as module 455 of FIG. 4. Implementations are not limited to configurations with the illustrated conductive element 150 locations.

Figure 1C:
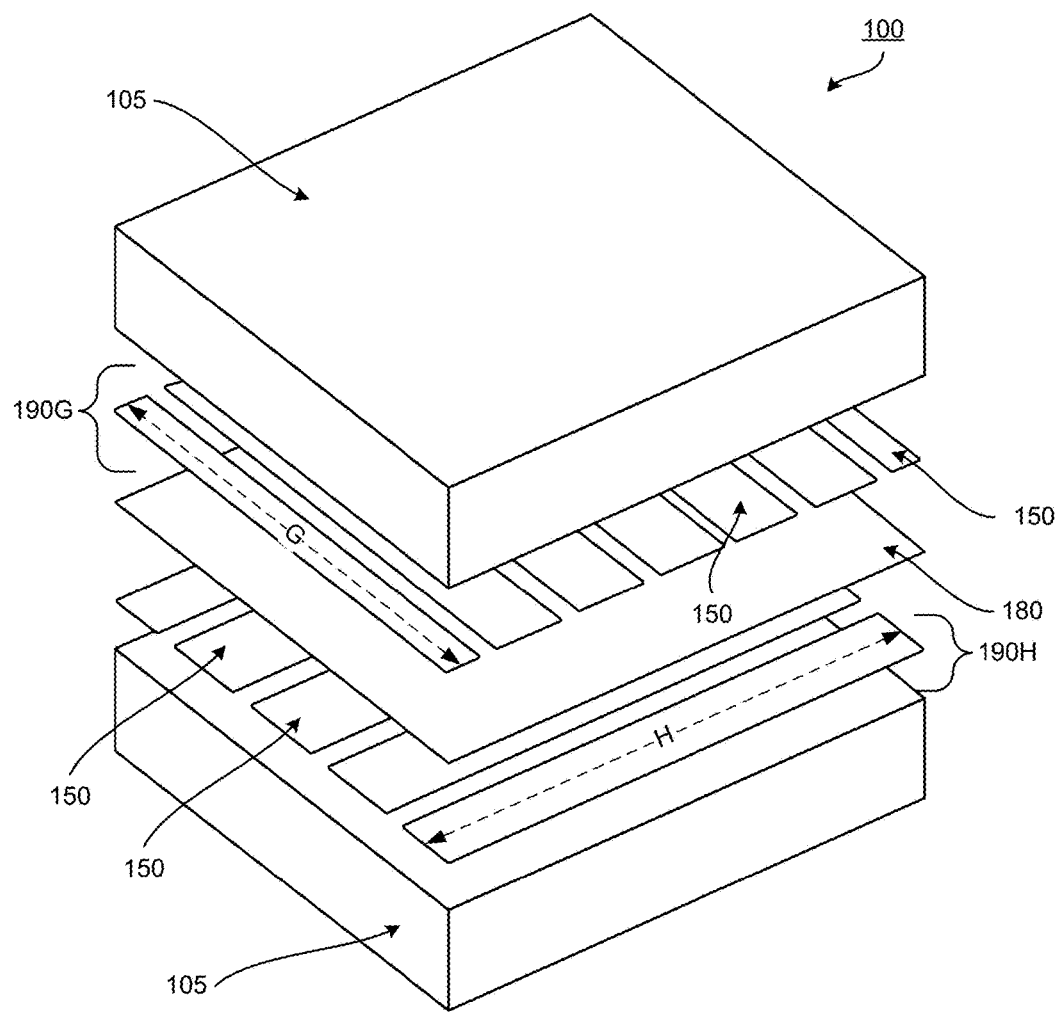

FIG. 1C is a high-level schematic diagram of a deformation gauge 100 that includes two separate composite polymeric foam pieces 105 (e.g., as described below with regard to FIG. 2A to 2E) separated at least partially by an electrically insulated substrate 180 that can be coated on one or both sides with a conductive layer 190. The substrate 180 may be a film or fabric. The substrate 180 may be solid or may have openings (holes). The conductive layers 190, e.g., 190G and 190H, may be comprised of one or more conductive elements 150, which can be applied by physical vapor deposition, conductive ink or paint applied to the substrate 180 and disposed into the polymeric foam 105. The substrate 180 acts as an electrical barrier separating the composite polymeric foam 105 into two portions. As with other implementations, the conductive elements 150 measure the charge created by the composite polymeric foam 105. In some applications the conductive elements 150 of the conductive layers 190, e.g., 190G or 190H, can be patterned to measure locationality of deformation. For example the top layer 190G can be patterned along a first axis G while the lower layer 190H can be patterned along a second axis H. In addition, conductive elements 150 closest to the impact site on both sides may measure a higher voltage than conductive elements further from the impact site. Although the differences may be slight, they can be used to approximate the location along both axes of the deformation gauge 100 the impact occurred, e.g., by a compression impact analysis module, such as module 455 of FIG. 4. The conductive elements 150 of FIG. 1C may have a sensing radius that extends from the edge of the conductive coating outward. Implementations are not limited to configurations with the illustrated conductive element 150 locations. In addition, the conductive elements 150 could be patterned to all come to one location to connect to the voltage detecting device.

Figure 2A:
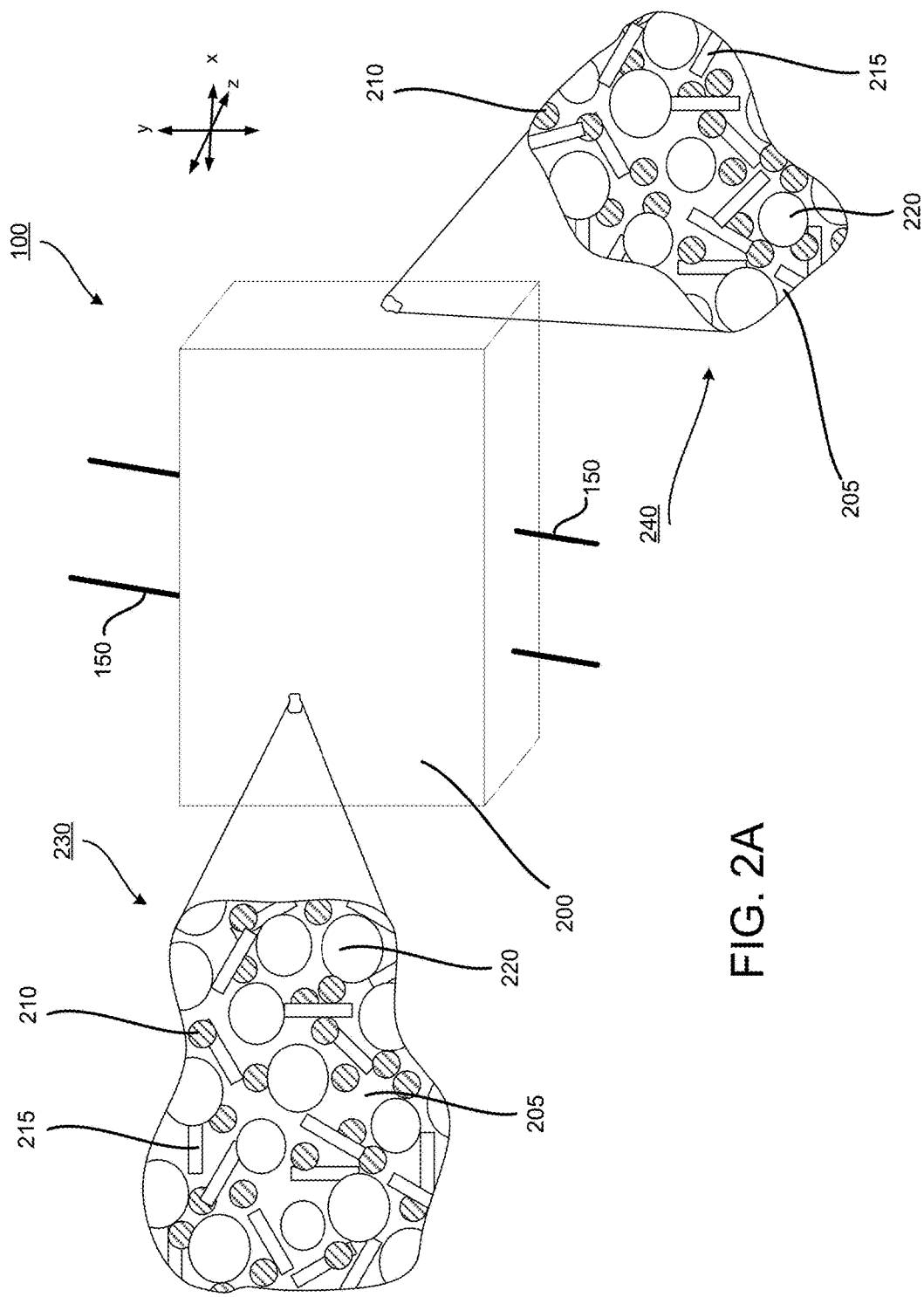

FIG. 2A is a high-level schematic diagram of a deformation gauge 100 that includes a composite polymeric foam 200 that enhances the charge generated in response to deformation, according to one implementation. The composite material 200 both generates charge and exhibits a piezoresistivity in response to compressive deformation. The composite material 200 may include several components: a polymeric foam matrix 205 with one or more conductive fillers (e.g., conductive nanoparticles 210, conductive stabilizers 215), and voids 220. The voids 220 and conductive fillers may be uniformly dispersed throughout the matrix 205. The matrix 205 may be any polymer, such as a silicone-based material, a polyurethane material, other foam-like material, etc., that includes voids 220 throughout the material. In other words, the matrix 205 has elasticity, porosity, and high failure deformation.

In some implementations, the polymer matrix 205 may be a foam-based product that forms voids 220, for example through a chemical reaction, introduction of a foaming agent, through gas injection, etc. The voids 220 may give the composite material 200 relatively low weight, relatively low density, and relatively high energy absorption. In other words, unlike a solid material, in composite material 200 the voids 220 are dispersed throughout the matrix 205. For example, the density of the polymer used for matrix 205 may be approximately two to thirty times greater without the voids than with the voids. For example, in some implementations the composite material 200 may have a density from 50 kg/m$^3$ to 800 kg/m$^3$.

The composite material 200 may also have porosity due to the voids 220. The porosity of the composite material 200 may be defined in terms of the volume fraction of air and the size of the voids 220. Each of these elements may be affected by several factors, including the polymer used as the matrix 205, the process used to form the voids 220, confinement of the composite material 200 during formation of the voids and/or curing (e.g., size and shape of a mold and amount of composite material introduced into the mold), and the amount and type of the conductive fillers mixed with the polymer, etc. For example, inclusion of conductive nanoparticles tend to decrease the size of the voids. Voids may be open-cell (e.g., the voids may run into or connect with each other) or closed-cell (e.g., the voids are separate from each other) and can vary in size depending on a number of factors. In some implementations the voids 220 may range in size up to 1000 μm.

In some implementations, the polymer used as the matrix 205 may be capable of being mixed with conductive fillers prior to curing. For example, some polymers may be thermoset, or irreversibly cured via heat, a chemical reaction, or irradiation. Prior to curing, conductive fillers may be combined with the uncured polymer. For example, a polymeric foam cured via a chemical reaction may include two parts, the polymeric foam being formed when the two parts are mixed or combined. Once combined, the two parts chemically react, generating the air pockets or voids characteristic of foam, and harden. Conductive fillers may be mixed with one or both parts prior to combining. Some polymers may be mixed with a foaming agent prior to curing. Such polymers may be combined with conductive fillers prior to mixing with the foaming agent. Voids may be formed in the polymer by gas injection, by whipping, etc. Some polymers may be cured via heat. Thermoset polymers may be cast, molded, sprayed or extruded after mixing and before they cure. In some implementations, the conductive elements 150 may be inserted into a mold prior to curing, casting, spraying, or extruding. In some implementations, the conductive elements 150 may be inserted into the composite material 200 after the composite material 200 has been cast or molded. The conductive fillers have a disparity with the triboelectric affinity of the polymer, a greater the disparity resulting in higher triboelectric generation.

In some implementations, the conductive filler may include conductive nanoparticles 210. Conductive nanoparticles 210 are particles with at least one dimension that measures 1000 nanometers or less and that also made from a material that conducts electricity. Examples of such conductive materials include nickel, platinum, gold, silver, copper, etc. Examples of conductive nanoparticles include nanowires, powders, and nanostrands. One type of nanostrand that can be included is a nickel nanostrand (NiN). NiNs are available from Conductive Composites, LLC (Heber City, Utah) and are described by U.S. Pat. No. 7,935,415 entitled "Electrically Conductive Composite Material" and U.S. Pat. No. 8,361,608, entitled "Electrically Conductive Nanocomposite Material," which are incorporated herein by reference.

The conductive filler may also include a plurality of conductive stabilizers 215. The conductive stabilizers 215 may also be added to the uncured polymer prior to formation of the voids 220. The conductive stabilizers 215 may be any conductive material that acts as a stabilizer. In one implementation, the conductive stabilizers 215 may be conductive fibers or fibers coated with a material that conducts electricity. For example, the conductive stabilizers 215 may be carbon fibers, carbon fibers coated with pure nickel, etc. In some implementations, the fibers may be coated approximately 20-40% by weight with the conductive material. The fibers may be cut to short lengths, for example from 0.1 to 3 mm. The fibers may have a diameter of up to 10 μm (e.g., 0.2 μm, 1 μm, 5 μm, 8 μm). In some implementations, the fibers may be hollow (e.g., tubes). In some implementations, the fibers may be nickel-coated carbon nanotubes (CNTs) or nickel-coated carbon fibers (NCCFs), which are also available from Conductive Composites, LLC. The conductive stabilizers 215 may increase the strength and energy absorption capabilities of the composite material 100. The conductive nanoparticles 210 may also increase the strength and energy absorption capabilities of the composite material 200, but typically to a lesser extent than the conductive stabilizers 215. In some implementations, the conductive nanoparticles 210 may be a primary conductive filler and the conductive stabilizers 215 may be a secondary conductive filler. In some implementations, the conductive fillers may be one to twenty five percent by weight of the composite material 200.

Because the conductive fillers, for example conductive nanoparticles 210 and/or the conductive stabilizers 215, are mixed with, and thus disposed throughout, the polymer matrix 205, the composite material 200 is uniform. Put another way, the composite material 200, and thus the deformation gauge, does not have layers and its composition is generally consistent at a macroscopic (e.g., naked eye) level from outer surface (outer wall) to outer surface. The composite material 200 may also have isotropic properties at a macroscopic level in that it does not exhibit a preferred directionality. For example, the conductive material 200 may generate charge or exhibit piezoresistivity along the x-axis, the y-axis, and the z-axis, which are illustrated in FIG. 2A. In other words, the composite material 200 may generate charge or exhibit piezoresistivity detectable from one outer surface of the material to another outer surface, regardless of which outer surfaces are used. As illustrated in FIG. 2A, the conductive nanoparticles 210 and the conductive stabilizers 215 may not be easily visible without magnification, such as magnification areas 150 and 160. At a microscopic level, e.g., illustrated by magnification areas 230 and 240, the components of the composite material 200 may be distinguishable, but may be generally dispersed in a consistent or even manner along any axis. Thus, while not exactly the same, the general composition of areas 230 and 240 are similar even at the microscopic level.

Due to the inclusion of conductive fillers, such as conductive nanoparticles 210 and/or conductive stabilizers 215, the composite material 200 exhibits negative piezoresistivity and generates charge in response to an impact or other deformation applied along any axis, such as the x axis, the y axis, and the z axis. Put another way, the measured electrical response is consistent in any direction over a same distance. For example, if an electrical response is detected along a first axis, a same distance is any distance within a sphere where the first axis is the diameter. Thus, when used in a deformation gauge, composite material 200 is not limited to measuring impacts that arrive from a predetermined orientation with respect to the composite material 200. A material that exhibits a piezoresistive effect changes electrical resistance when compressed. A gauge with a negative piezoresistive effect becomes less resistant with increased deformation, meaning a current will flow more easily through the material when compressed than through the material in its resting state. On the other hand, a gauge with a positive piezoresistive effect becomes more resistant with increased deformation, meaning a current will not flow as easily. Traditional strain gauges measure strain by utilizing positive piezoresistivity; i.e., the electrical resistance increases with increased strain. The increased resistance in traditional strain gauges occurs due to Poisson-thinning of the strain gauge material. When a current producing device, such as a battery, is operatively coupled to the material, a change in the current may be measured as the material undergoes deformation. A sensor with a negative piezoresistive effect may be desirable for many applications since it will draw little or no current when the material is not strained, potentially prolonging the service time for battery powered applications. The change in electrical resistance is one type of electrical response to impact.

On the other hand, a material that produces a charge generates electric potential, in the form of a voltage that can be measured. Thus, a material that produces a charge may generate a voltage that can be measured without the need for an external current producing device, such as a battery. The charge generated is another type of electrical response to impact. A material that generates a charge does not automatically produce a piezoresistive response and vice versa.

The composite material 200 is capable of being sculpted in any direction without affecting the generation of charge or the piezoresistive effect of the composite material because it is uniform between outer walls. In other words, because the composite material 200 does not include layers, it may be cast and then cut or sculpted in any direction without affecting its ability to enhance the charge generated. Moreover, the composite material 200, once cured, does not need to be charged; the generation of charge in response to impact is inherent in the composite material 200 itself.

In some applications, due to the elasticity of the matrix 205, the composite material 200 is able to measure deformation up to 80% strain without permanent deformation. In contrast, the most commonly used strain sensors, metal foil tensile strain gauges, can only measure small strains, up to approximately 5% strain, being limited by the yield point of the metallic materials used in the gauge. For example, nickel alloy foil gauges will permanently deform when strained over 7%, destroying the gauge. Unlike traditional metal foil strain gauges, the composite material 200 can be easily used in biological settings, which routinely experience strains on the order of 5% to 40%. The composite material differentiates itself from recently developed High Deflection Strain Gauges (HDSGs) that are able to provide accurate readings of strain up to 40% by measuring a piezoresistive response to tensile strain. The HDSGs have been successfully applied to a variety of biomechanical situations, but are configured specifically to quantify tensile strains, not compression strains. This limits their usefulness because in many biological settings it is important to quantify compression or impact strains.

Figure 2B:
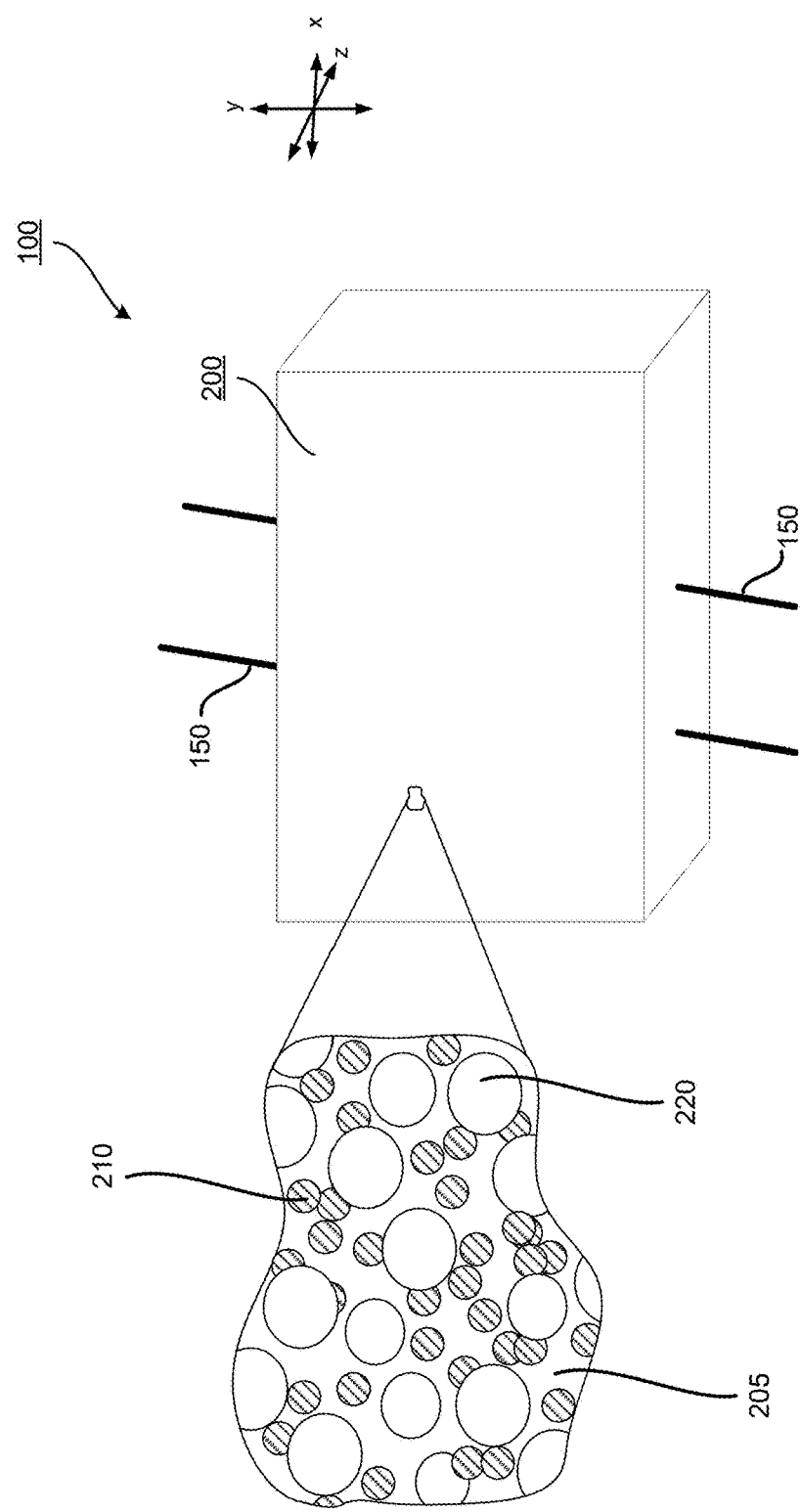
Figure 2D:
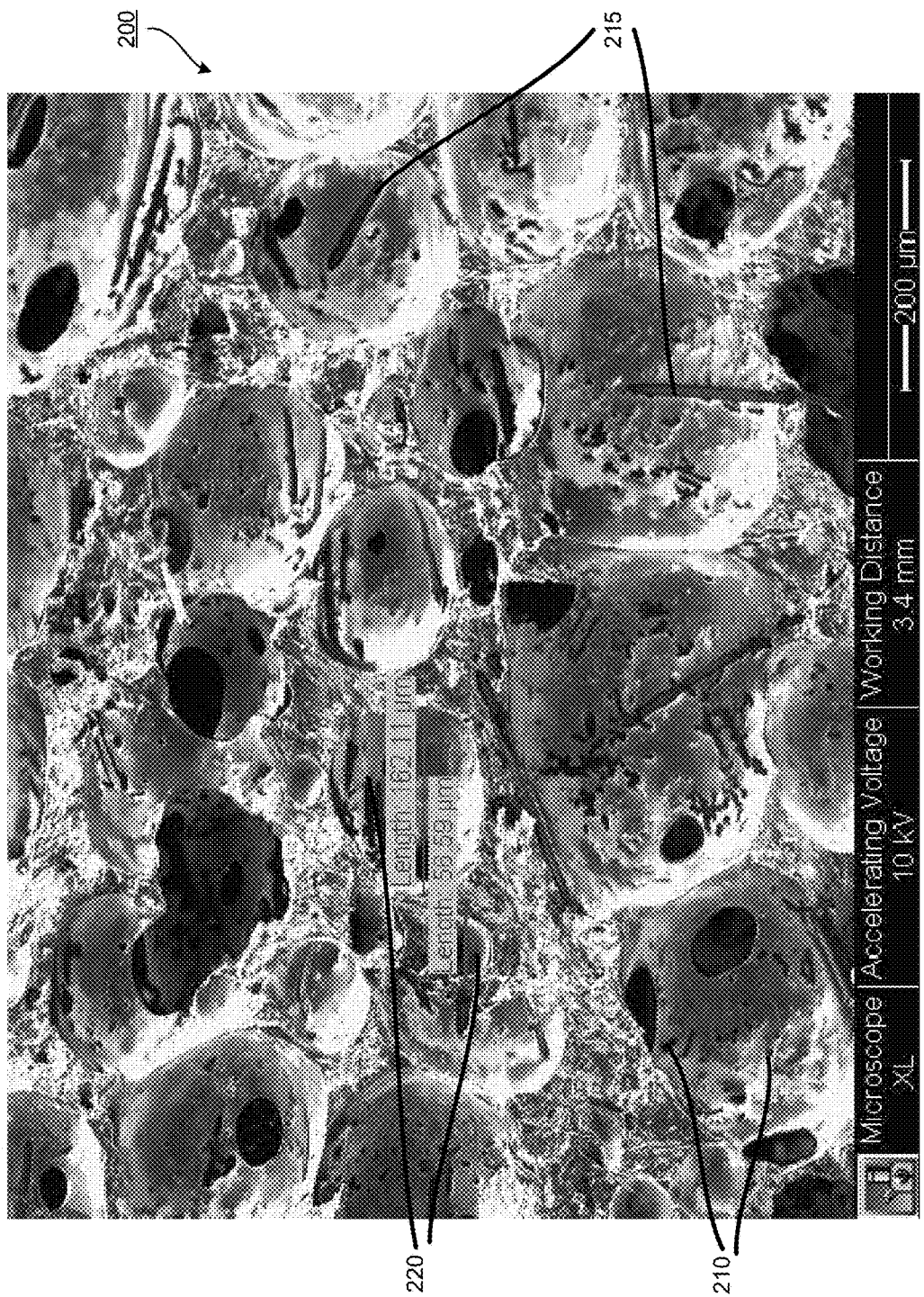
FIGS. 2D and 2E are microscopic images of an example uniform composite polymeric foam, according to an implementation.
Figure 2E:
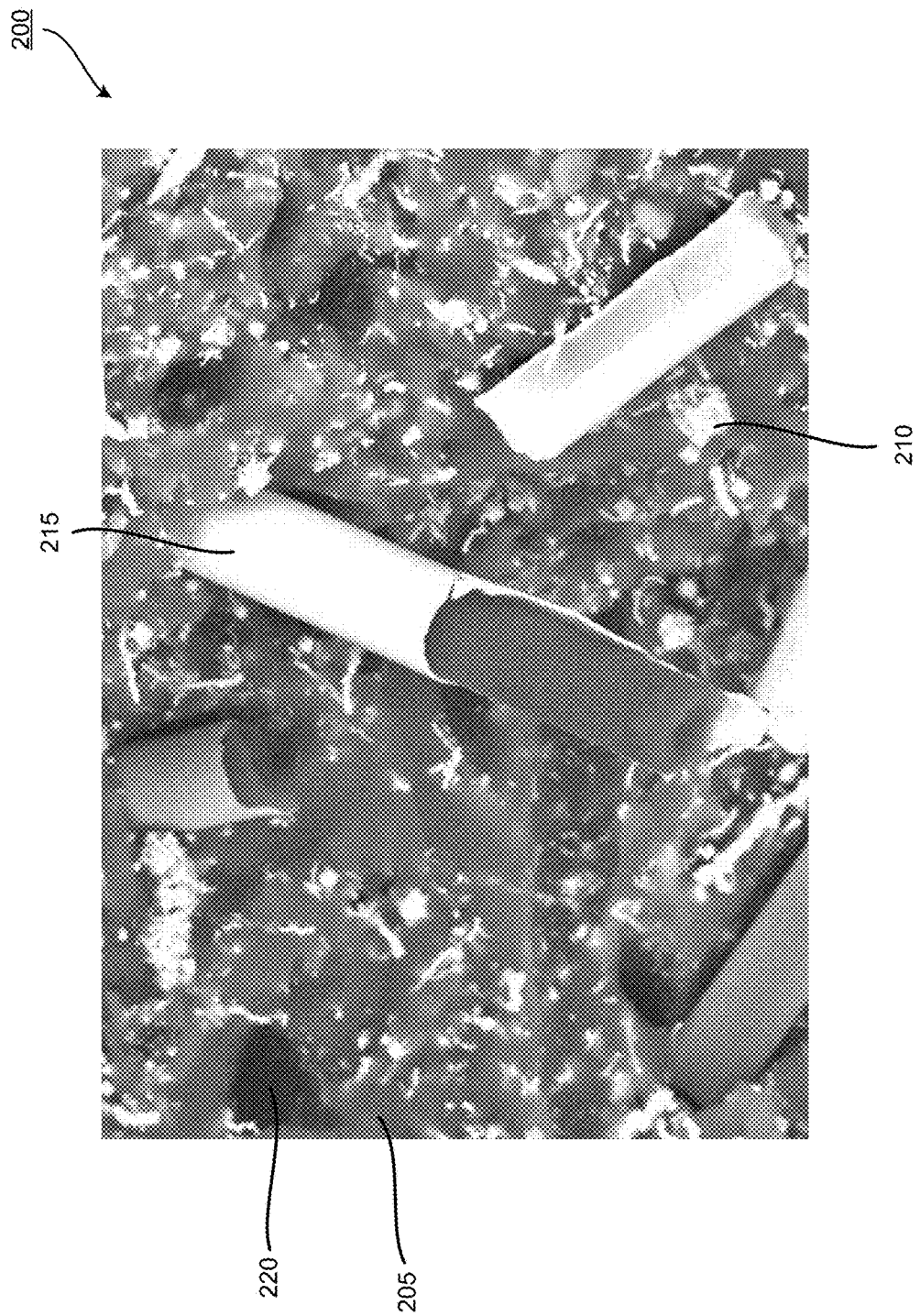

FIGS. 2D and 2E are images of an example composite material 200 taken with an electron microscope. Image 2D illustrates a composite material 200 with voids 220 of varying size. Also illustrated in FIG. 2D are example conductive stabilizers 215 and conductive nanoparticles 210. In the example of FIG. 2D, the elastomeric polymer is a silicone foam with fairly large, open-celled, voids 220. Voids 220 in a silicone foam may average 10 µm to 500 µm. Image 2E is a view of an example composite material 200 taken at higher magnification. Image 2E illustrates how the conductive nanoparticles 210 may be evenly dispersed and disposed through the matrix 205. Image 2E also illustrates that the size of the conductive stabilizers 215 is much larger (e.g., orders of magnitude larger) than the conductive nanoparticles. The elastomeric polymer in the example of FIG. 2E is a urethane foam with the same conductive fillers used in the example of FIG. 2D, but with fewer voids 220. Voids in urethane foam may average between 80 µm and 300 µm. Thus, as illustrated by FIGS. 2D and 2E, the composite material 200 may have varying amounts and sizes of voids depending on the formulation of the material, how material is mixed, formed, and/or cured.

Implementations are not limited to a composite material 200 that includes both conductive nanoparticles 210 and conductive stabilizers 215. FIG. 2B illustrates an implementation of composite material 200 that includes the polymer matrix 205, voids 220, and the conductive nanoparticles 210 as the conductive filler without the conductive stabilizer. FIG. 2C illustrates another implementation of composite material 200 that includes the polymer matrix 205, the voids 220, and the conductive stabilizers 215 as the conductive filler without the conductive nanoparticles. The variations of composite material 200 illustrated in FIGS. 2A through 2C all enhance the charge generated and sensing capabilities of the conductive elements 150. The amounts and types of conductive fillers used affect the amount of energy absorption of the composite material 200, the cost of the composite material 200, the strength of the generated charge, the strength of the piezoelectric response, etc. It is recognized that the amounts and ratios may be dependent on many factors, such as the function of the composite material as padding or protection, the desired cost, the anticipated amplitude of impacts, etc.

Figure 3:
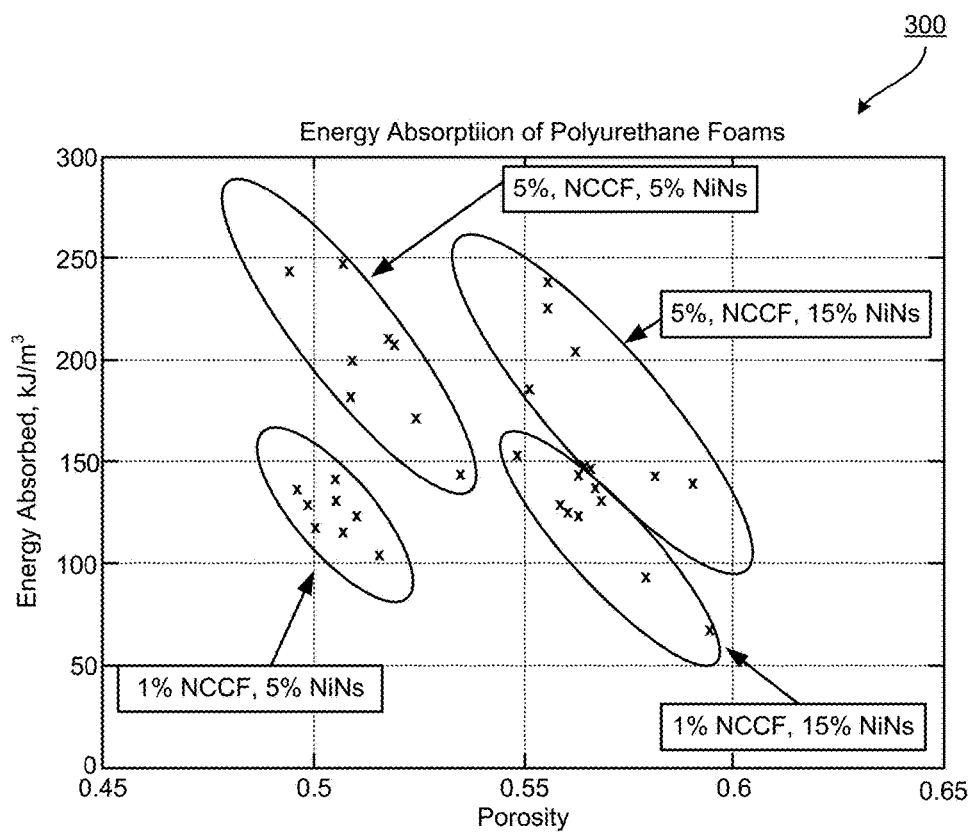
FIG. 3 is a graph illustrating energy absorption values and percent air by volume for polyurethane foams mixed with varying amounts of conductive fillers.

FIG. 3 is a graph 300 illustrating how varying portions of conductive fillers may result in variations in energy absorption among composite materials. In the example of FIG. 3, the matrix 205 is a polyurethane foam with various concentrations of conductive fillers disposed therein. The conductive fillers disposed in the polyurethane foam of FIG. 3 are Nickel Nanostrands (NiNs) and nickel-coated carbon fibers (NCCFs). Table 2 below illustrates sample compositions used to generate graph 300.

TABLE 2

| Sample | Weight(g) | Porosity (% Air) | Conductive Filler (% Weight) |
|---|---|---|---|
| 1 | 14.35 | 59.16 | 12.0 |
| 2 | 15.39 | 56.20 | 12.0 |
| 3 | 17.47 | 55.13 | 22.0 |
| 4 | 17.32 | 55.51 | 22.0 |
| 5 | 17.48 | 55.10 | 17.0 |
| 6 | 16.92 | 56.54 | 17.0 |
| 7 | 17.14 | 53.23 | 12.0 |
| 8 | 17.75 | 51.57 | 12.0 |
| 9 | 15.01 | 59.04 | 17.0 |
| 10 | 13.99 | 61.83 | 17.0 |

As illustrated in graph 300, mixing a higher concentration of conductive nanoparticles 210 (e.g., the NiNs) with the polyurethane foam prior to curing may result in a higher volume fraction of air, which is one component of porosity, of the composite material 200. A higher concentration of conductive stabilizers 215 (e.g., the NCCFs), may result in higher energy absorption. Graph 300 illustrates how varying amounts of conductive nanoparticles 210 and conductive stabilizers 215 may affect the properties of the composite material 200. The Table 3 also demonstrates that the conductive fillers may be up to 25% by weight of the composite material. Of course, the compositions used in Table 3 and graph 300 are provided as examples only and implementations are not limited to the amounts, compositions, or component materials used to generate graph 300.

Differing the amount and types of conductive fillers may also affect the piezoelectric response and the piezoresistivity of the composite material. For example, when the conductive fillers create a continuous conductive path (a percolating network) of conductive particles and nano-scale junctions between those particles, the composite material 100 may exhibit better (e.g., more pronounced) piezoresistivity, in the form of a decrease in electrical resistance with increased strain. When the conductive fillers do not form a continuous path (e.g. for charge dissipation), the composite material 100 may exhibit better or more pronounced piezoelectric responses.

Figure 4:
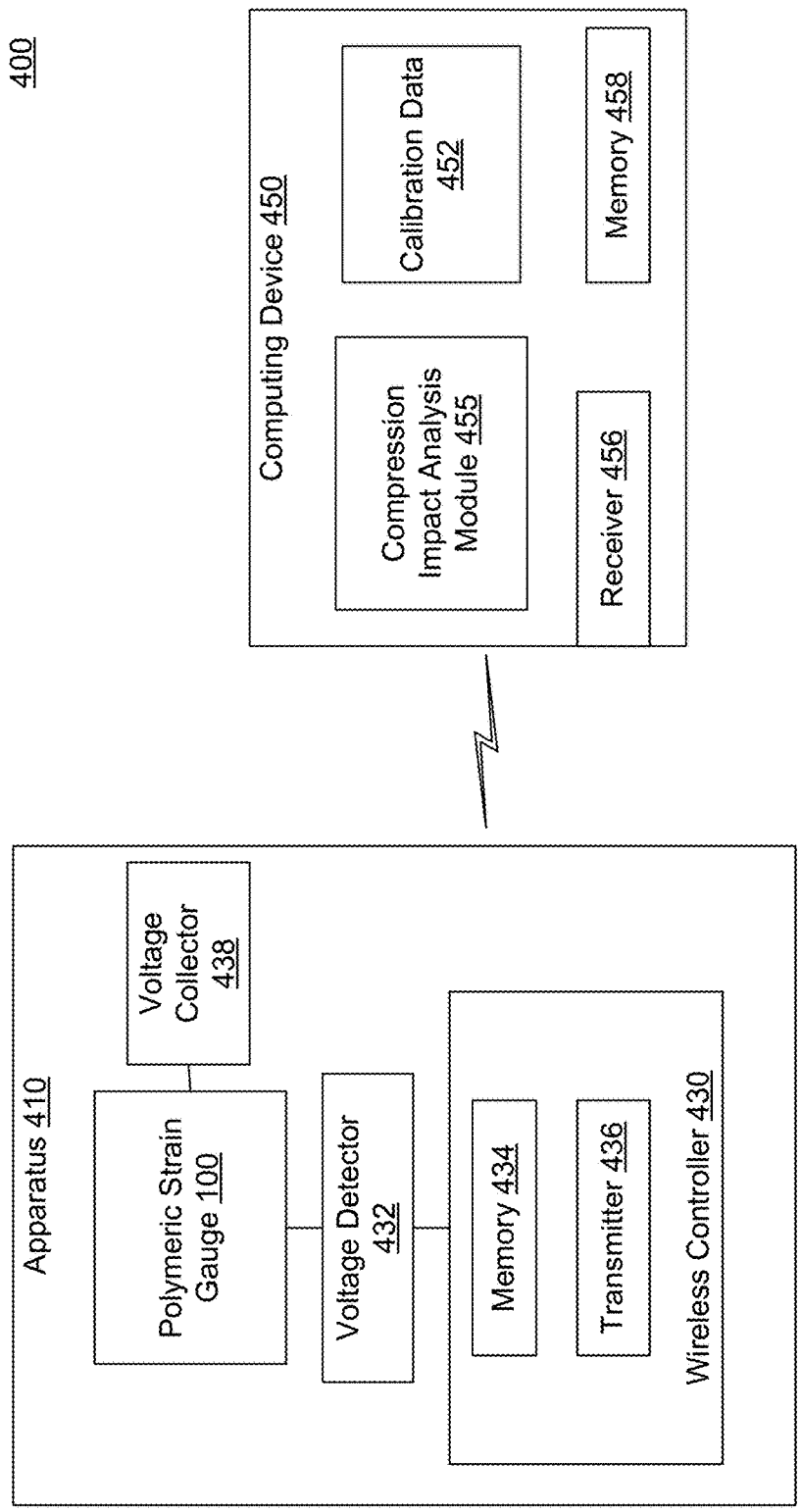
FIG. 4 is a high-level block diagram that illustrates an example of a system that uses a polymeric deformation gauge, according to an implementation.

FIG. 4 is a high-level block diagram that illustrates an example of a system 400 that uses a polymeric deformation gauge, according to an implementation. The system may include apparatus 410. Apparatus 410 may include the polymeric deformation gauge 100, which is a polymeric foam 105 with conductive elements 150 disposed therein. The polymeric foam 105 can be a neat foam (no conductive fillers) or a composite material 200 that includes the polymer foam matrix and conductive fillers. The polymeric deformation gauge 100 may be the deformation gauge 100 described with respect to FIGS. 1A, 1B, and 2A through 2C. The apparatus 410 may include a voltage detector 432 operatively coupled to the polymeric deformation gauge 100. In some implementations, the voltage detector 432 may be coupled to the polymeric deformation gauge 100 via one or more of the conductive elements disposed in the polymeric foam. In some implementations the apparatus 410 may include a plurality of voltage detectors 432, each operatively coupled to the polymeric deformation gauge 100, for example via a plurality of conductive elements disposed in the polymeric deformation gauge. The voltage detector 432 may be capable of detecting voltage generated by the polymeric deformation gauge 100 when the polymeric deformation gauge 100 experiences deformation, for example due to an impact. The polymeric deformation gauge 100 may generate a charge due to a triboelectric effect at the interface of the polymeric foam and the conductive elements. This effect may be enhanced when the polymeric foam is composite material 200. The voltage detector 432 may be any device that detects or uses voltage, including, for example, a light that lights up when voltage is detected or produces a value that can be stored. In some implementations, the voltage detector 432 may also include other components (not shown), such as memory and/or a processor, (e.g., a processor formed in a substrate).

The voltage detector 432 may be operatively coupled to a memory 434 and/or a transmitter 436. The memory 434 may be any type of volatile or non-volatile memory capable of storing data. In some implementations, the voltage detector 432 may be capable of converting detected voltage into a value that is stored in the memory 434. In some implementations the memory 434 may be a component of the voltage detector 432. In some implementations, the memory 434 may store additional information with the voltage value, such as the date and/or time the value was detected. In some implementations, with multiple voltage detectors 432, the additional information may include an identifier of the voltage detector that detected the value. The memory 434 may also store other information with the voltage value. The voltage value and additional information, if any, are considered voltage data. Thus, the memory 434 may store voltage data detected after a deformation event, such as an impact received by the composite material 100. In some implementations, the memory 434 may store a plurality of voltage data, representing a plurality of deformation events. The memory 434 may store the plurality of voltage data until it is transmitted to a computing device, either wirelessly or via a wired connection.

In some implementations, the memory 434 may be operatively coupled to a transmitter 436. The transmitter 436 may be capable of transmitting data wirelessly, or transmitting data via a wired connection, such as a Universal Serial Bus (USB) cable. In some implementations, the memory 434 and the transmitter 436 may be included in a wireless controller 430. The wireless controller 430 may be a wireless microcontroller, for example the Synapse SNAP. The wireless micro-controller may enable the apparatus 410 to have a small form-factor while still being able to transmit voltage data to a computing device with capacity to analyze the data. The small form factor of the voltage detector 432, the memory 434, and the transmitter 436 allow existing products to include the apparatus 410 without significant redesign. The small form-factor also results in an apparatus 410 that is highly portable, making it useful in many biological settings. This is a benefit over many currently available high deflection strain sensors that are inadequate when measuring strain or deformation in biological settings because they can be cumbersome, challenging to calibrate, and are often expensive. In some implementations, the transmitter 436 may transmit the voltage data from the memory in response to a command from a computing device, such as computing device 450. In some implementations, the transmitter 436 may be configured to transmit the voltage data in response to the data being stored in the memory. In some implementations, the voltage detector 432 may be operatively coupled to the transmitter 436 and memory 434 may be optional. In such an implementation, the transmitter 436 may transmit the voltage data as soon as the transmitter 436 receives voltage data.

The transmitter 436 may transmit voltage data to a computing device 450. The computing device 450 may be an external computing device, separate from the apparatus 410. In such implementations, the computing device 450 may include a receiver 456. In some implementations, the computing device 450 may be incorporated into the apparatus 410. The computing device 450 may be any type of computing device, such as a controller (e.g., a processor, a microcontroller, etc.), a tablet, a laptop, a smartphone, a server, a television with a processor, etc. The computing device 450 may include a compression impact analysis module 455. The compression impact analysis module 455 may be configured to interpret the voltage data received from the apparatus 410. Interpreting the voltage data may include determining a deformation for the strain event, determining a series of deformations for a series of strain events, determining a strain rate, and/or providing an analysis of the deformation(s) and strain rates. For example, the compression impact analysis module 455 may have access to calibration data 452 that enables the compression impact analysis module 455 to convert the voltage value into a value representing the deformation experienced by the gauge 100 as a result of the impact. Deformation can represent compression strain (e.g., compression percent), tensile strain (e.g., stretch percent), or other strain (geometrical distortion) related to stress, force, amplitude, the impulse (e.g., force applied and the amount of time the force is applied), and/or the impact energy absorbed as a result of an impact event. In some implementations, the compression impact analysis module 455 may also be able to determine strain rate of an impact event. For example, if the deformation gauge 100 undergoes a repeated impact having the same deformation, any changes in detected voltage may be due to different strain rates. For example, an impact with a known deformation produces more voltage when the impact occurs at a faster rate. In some implementations, the compression impact analysis module 455 may provide a user with the analysis, for example through a user interface (e.g., a report, a display, etc.).

The computing device 450 may also include a calibration data 452. The calibration data 452 may be used by the compression impact analysis module 455 to analyze and interpret the voltage data. In some implementations the calibration data 452 may be provided to the computing device 450. In some implementations, the computing device 450 may include a module (not shown) that collects and stores the calibration data 452. The calibration data 452 may represent the voltage values associated with impacts of known deformation and strain rate. Because the composition of the deformation gauge 100, for example the surface area of the conductive elements, whether the polymeric foam is neat or a composite, the amount of conductive nanoparticles and conductive stabilizers in the composite, can affect the charge generated by the deformation gauge 100. A deformation gauge 100 that is manufactured outside of a controlled environment (e.g., outside of an established manufacturing process) may need to be calibrated after each manufacture. A deformation gauge 100 that is manufactured in a controlled environment, however, may not need calibration after every manufacture.

In some implementations, the apparatus 410 may be embedded, inserted, implanted, or otherwise disposed in a helmet. In such an implementation, the deformation gauge 100 may be disposed in the helmet as padding and function as protective padding as well as a compression deformation gauge. The apparatus 410 disposed in a helmet may transmit voltage data to an external computing device 450 so that impacts received by the deformation gauge 100 may be analyzed in real-time. This enables coaches and medical personnel, for example, to evaluate the risk of a concussion almost as soon as the impact happens. The apparatus 410 in a helmet may also store voltage data (or a plurality of voltage data) until an external computing device 450 requests the data. In this manner, for example, medical personnel could retrieve data after an accident, for example a bicycle accident, to evaluate the seriousness of any impacts received. In some implementations, the apparatus 410 may be disposed in other types of protective gear, such as boxing gloves, a fencing jacket, or other equipment, such as a punching bag, etc. The apparatus 410 may function in this equipment as protective padding while also providing information on the impacts received by the protective gear or other equipment.

In some implementations, the apparatus 410 may be disposed in a shoe. For example, the apparatus 410 may be a smart-insole that can enable analysis of an individual's gait in a natural environment outside of a controlled lab. The deformation gauge 100 may thus function as a padded insert as well as a compression deformation gauge. The apparatus 410 may provide feedback for orthopedic fittings, training and caloric output, etc. In such implementations, the apparatus 410 may store a plurality of voltage data, corresponding to respective impact events, that is transmitted at the request of a user, an external computer, etc.

In some implementations, the apparatus 410 may be disposed on a structure, such as an artificial limb. The deformation gauge 100 may be used, for example, as a skin for prosthetics to give feeling to the user. For example, the impact event may be pressing of a prosthetic finger against a hard surface (a touch) and the apparatus 410 may provide feedback to the user's nerve receptors about the impact or touch. The structure may also be a robotic appendage and the deformation gauge 100 may provide data to the robot about a touch in the same manner. In some implementations, the deformation gauge 100 may be disposed on a handle, such as a tennis racket, a golf club, or baseball bat and apparatus 410 can be used to analyze the grip of the user.

In some implementations, the apparatus 410 may be included in a mattress. The deformation gauge 100 may function as the mattress or a mattress pad as well as a deformation gauge. The apparatus may detect locations of pressure and actuate a mechanism to reduce pressure in said location. The reduction in pressure points may reduce the frequency of bed sores without caregivers interaction with patient. The apparatus 410 may thus enable the system to analyze motion movement as the user sleeps. The examples provided herein are not exhaustive and not intended to be limiting.

In some implementations, the apparatus 410 may be included in a carpet or pad. The deformation gauge 100 may function as the carpet pad or an activity pad as well as a deformation or pressure gauge. The apparatus may detect locations of impact or pressure, for example, acting as a sensor to one's presence in a security system. The deformation gauge 100 my function as an input to a game or interactive display where presence or impact level are of importance.

In some implementations, the apparatus 410 may also include a voltage collector 438. The voltage collector 438 may be any device capable of receiving the charge generated by the polymeric deformation gauge 100 and either storing the charge, e.g., by re-charging a battery or capacitor.

While FIG. 4 has been discussed with regard to compression strains, it is understood that the composite material 100 also generates voltage in response to tensile strains or other deformations. Thus, apparatus 410 may easily be adapted to detect and measure deformation, for example, in a bushing configuration where plates are pulled apart for part of a cycle. Accordingly, apparatus 410 is not limited to detecting and measuring compression strains.

Figure 5:
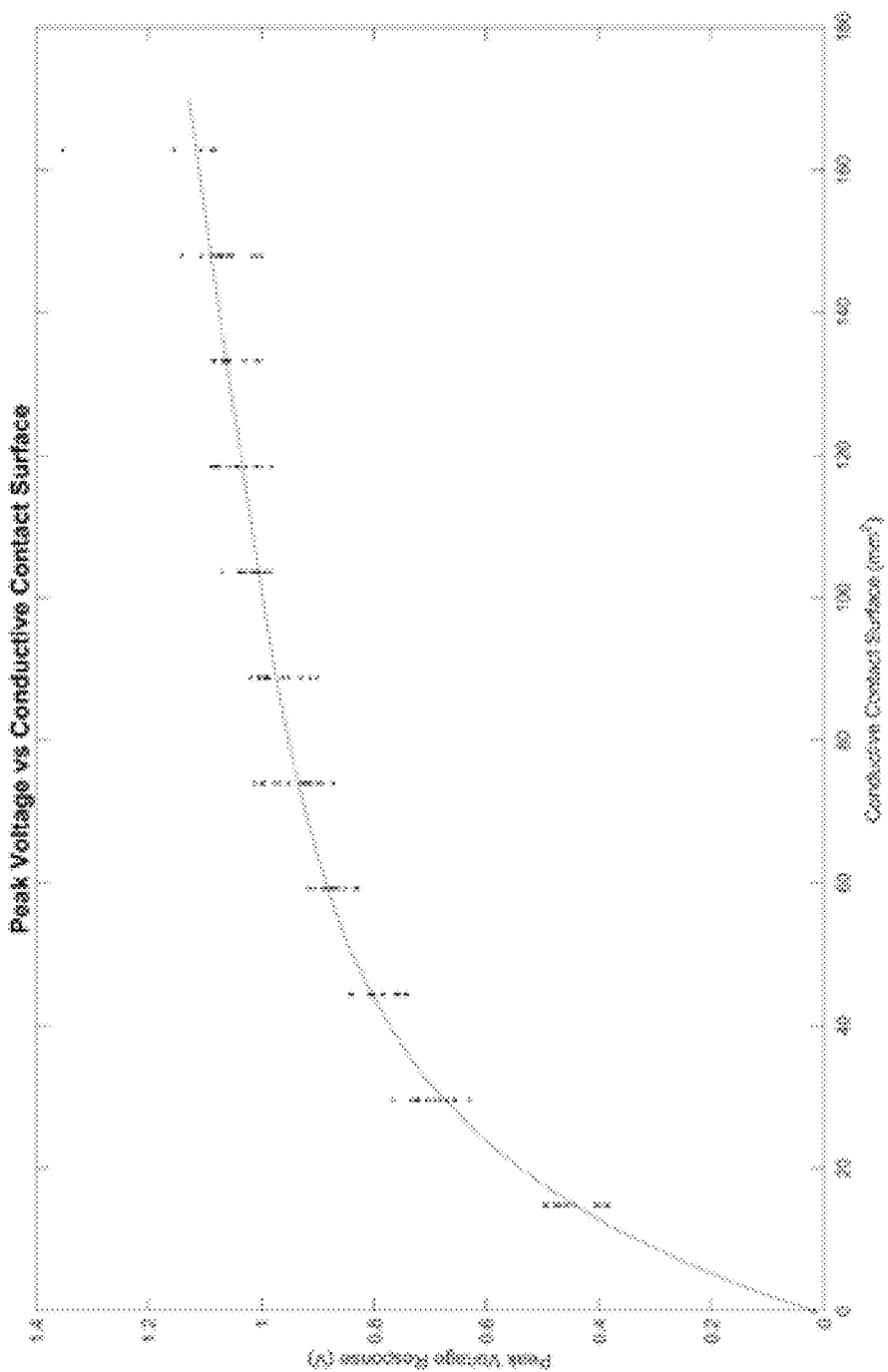
FIG. 5 illustrates a graph of peak voltage response as a function of surface area of the conductive elements in a neat polymeric foam, according to an implementation.

While neat foam will produce a triboelectric effect with conductive elements 150 disposed therein, use of a composite polymeric foam 200 enhances that effect. For example, FIG. 5 illustrates a graph of the peak voltage response (charge generated) as a function of the surface area of the conductive elements in a neat polymeric foam. In the example of FIG. 5, the polymeric foam is a polyurethane foam manufactured by Utah Foam, AFX-20702, and the conductive elements were copper wire with a diameter of 0.67 mm and each wire having a length of 76 mm. The volume of the polymeric foam was approximately 150e3 $mm^3$. Each 16 $mm^2$ increase on the plot represents an additional copper wire disposed in the polymeric foam. The graph of FIG. 5 illustrates the surface area of the conductive element(s) initially increases the peak voltage response quickly with the effect moving to a linear fashion with additional increased surface area. The graph of FIG. 5 also illustrates that the linear increase begins around a peak voltage of 1 volt. FIG. 5 also illustrates that additional conductive elements do not move the peak voltage much beyond 1 volt in the neat foam.

Figure 6:
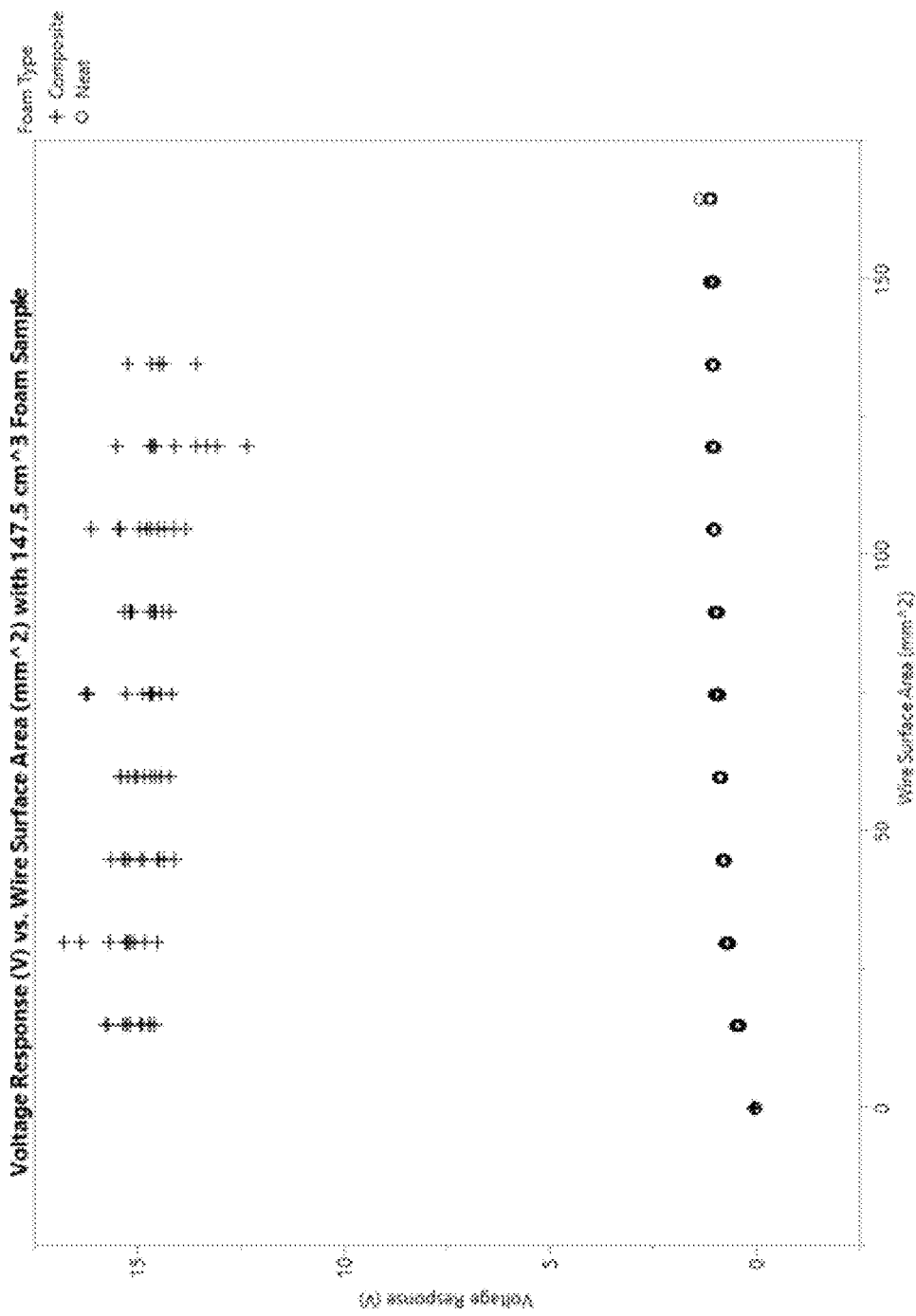
FIG. 6 is a graph illustrating a comparison between the peak voltage response as a function of the surface area of the conductive elements in a neat foam versus the surface area of the conductive elements in a composite foam, according to an implementation.

FIG. 6, in contrast, is a graph that illustrates a comparison between the peak voltage response as a function of the surface area of the conductive elements in a neat foam (no conductive fillers) versus the surface area of the conductive elements in a composite foam, such as composite material 200. The data for the neat foam shown in FIG. 5 is the same in FIG. 6, but FIG. 6 has a larger peak voltage scale in order to display the values for both the neat foam and the composite foam in the same graph. The voltage response of the neat foam is represented by plot points that appear as circles, while the voltage response of the composite foam is represented by plot points that appear as a plus sign. FIG. 6 illustrates that the composite foam experiences the same quick increase followed by a plateau, but at a much greater magnitude. For example, when the wire surface area is 50 $mm^2$, the voltage response of the neat foam hovers around 1 volt while the composite foam has a voltage response of around 15 volts. Because of the greater triboelectric response in a composite foam compared with a neat foam, the sensing radii in a composite foam would overlap but in a neat foam having the same conductive element configuration (e.g., the same number of wires of the same diameter/shape, spaced at the same distance) the sensing radii would not overlap. Because the sensing radii of the neat foam fail to overlap to the same extent, the voltage detector only receives some of the propagation of the voltage that the other wires collect. In the composite foam where the sensing radii overlap, the voltage is sensed as though all were connected together.

A higher voltage response provides additional resolution for determining the magnitude of an impact. In other words, a higher voltage response enables more precise determination of the magnitude. For manufacturing considerations though, maximum voltage response is balanced against the cost of manufacturing. Thus, the surface area of the conductive elements may be adjusted, along with the type of polymeric foam (neat or composite), and the amount and composition of the conductive fillers in a composite polymeric foam, to strike the right balance for the particular desired outcome. A manufacturer can predict and target a voltage response as a function of conductive surface area x using the following model: ( )=*+*, where a, b, c, and d are coefficients, as discussed above with regard to Table 1.

Figure 7:
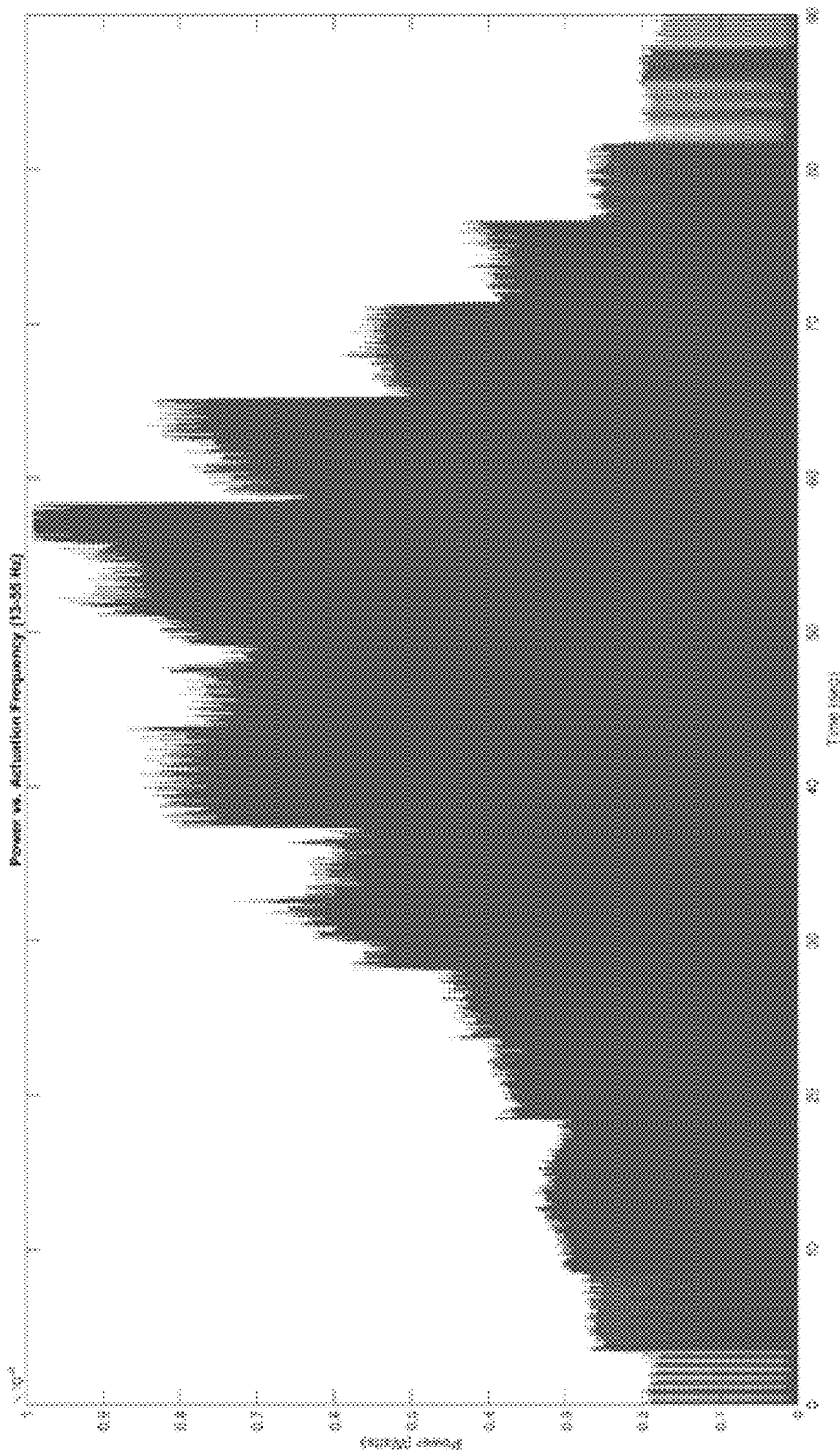
FIG. 7 is a graph illustrating power output from a composite foam sample tested with fixed magnitude cyclic strain, according to an implementation.

FIG. 7 is a graph illustrating power output from a composite foam sample tested with fixed magnitude cyclic strain, according to an implementation. Compression frequency starts and ends with 12 Hz and steps up and down with a max frequency of 55 Hz. As illustrated by FIG. 7, higher frequency cycling produces higher power output. This device could be used to measure a cyclic event such as a machine's vibrations or a person walking while also providing a secondary power source to the system. For example if the foam were optimized to generate power it could be used to extend the life of the battery in a wearable device or remote monitoring system or charge a capacitor.

Figure 8:
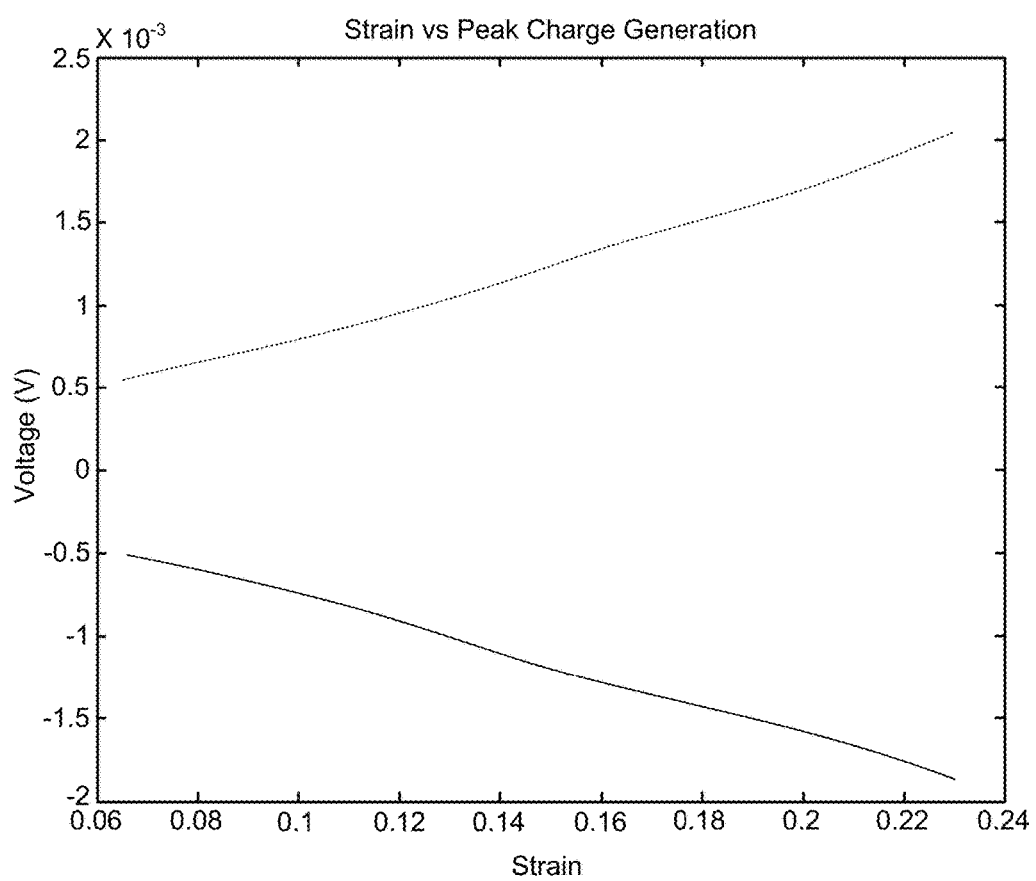
FIG. 8 is a graph illustrating the linear relationship between the piezoelectric response of one formulation of the composite material and amount of strain.

FIG. 8 is a graph illustrating the linear relationship between the voltage response of an example of a composite material 200 and deformation, or amount of strain. As the composite material is strained it generates a charge response that results in a voltage difference across a voltage detector. The response can be directly correlated to the amount of deformation the material experienced and is linear with respect to the deformation, as illustrated in the top line of FIG. 8. When the strain is released, the material generates a corresponding decrease in voltage response. These properties of the material allow calibration so that later strains can be measured with accuracy. It is understood that not all implementations of composite material 200 may exhibit a linear response. Some implementations may exhibit a non-linear response, but with proper calibration the response can be correlated to the amount of deformation the material experienced. In other words, the piezoelectric response varies with deformation in a manner than can be calibrated to determine the deformation of later impacts.

Figure 9:
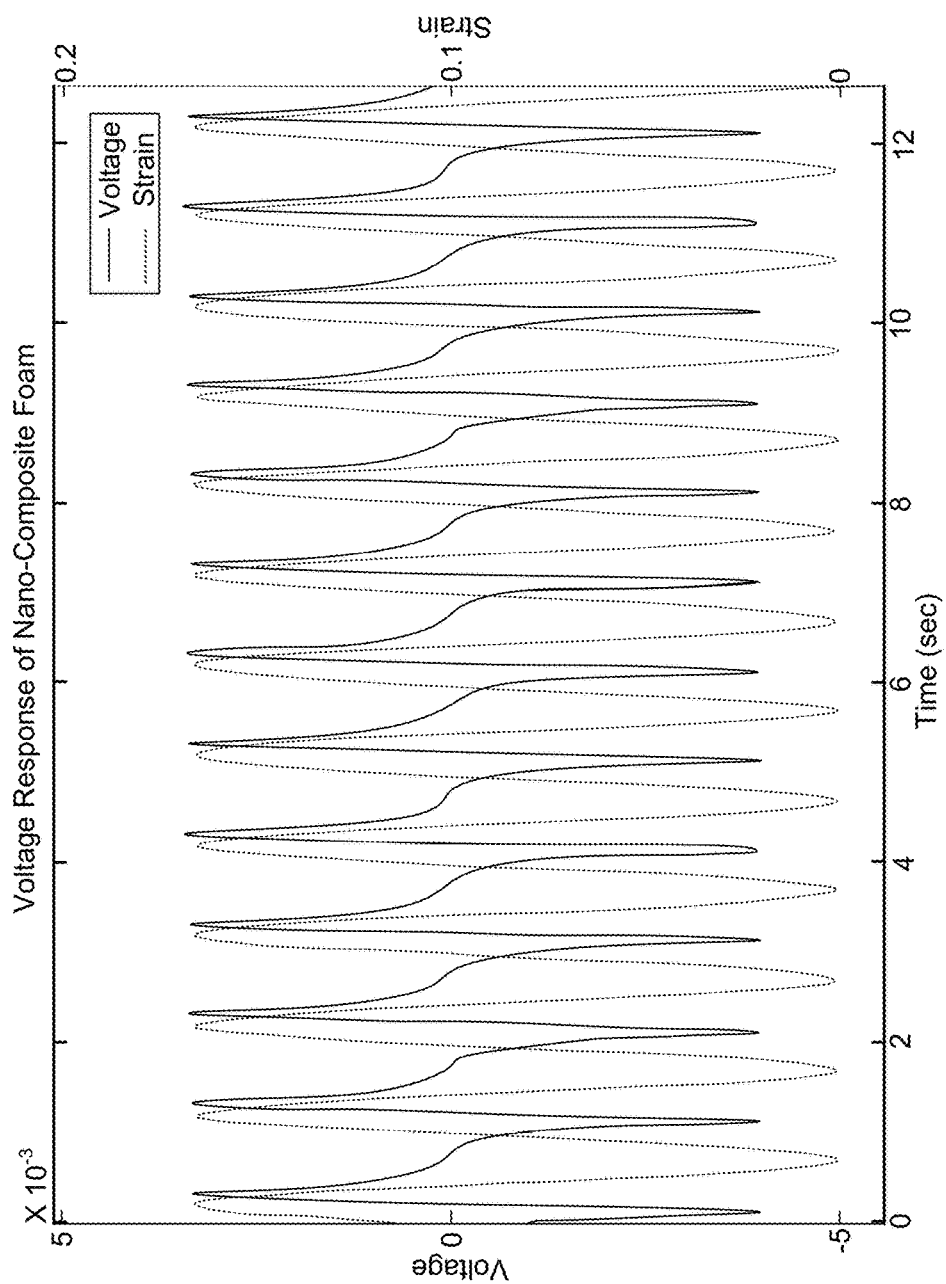
FIG. 9 is a graph illustrating the constancy of the voltage characteristics of the piezoelectric response of one formulation of the composite material through repeated strain events.

FIG. 9 is a graph illustrating the constancy (e.g. absence of drift) of the voltage response of some implementations of the composite material through repeated impact events. FIG. 9 demonstrates that the piezoelectric response of some implementations of the composite material 200 is highly repeatable and does not drift with repeated cycles. Although FIG. 9 illustrates 13 cycles, experiments have shown that drift is minimal over 60,000+ cycles and that the decay can be predicted over time. Many piezoelectric sensors, including the HDSGs, suffer from drift, which affects the ability to accurately measure strain over extended periods of time. Drift occurs when the piezoelectric response or piezoresistivity of the gauge degrades over time with repeated strain events. For example, a sensor that suffers from drift may produce 1 amp in response to an impact with a force of 1 newton a first time, 0.9 amps in response to the 1 newton impact a second time, 0.8 amps in response to the 1 newton impact a third time, etc. Thus, the sensor fails to accurately measure the deformation of the impact over repeated cycles without recalibration. Unlike many piezoelectric and piezoresistive sensors, including HDSGs, FIG. 9 illustrates that the composite material 200 produces a consistent voltage in response to repeated strain events, which is ideal for many biological settings.

Figure 10:
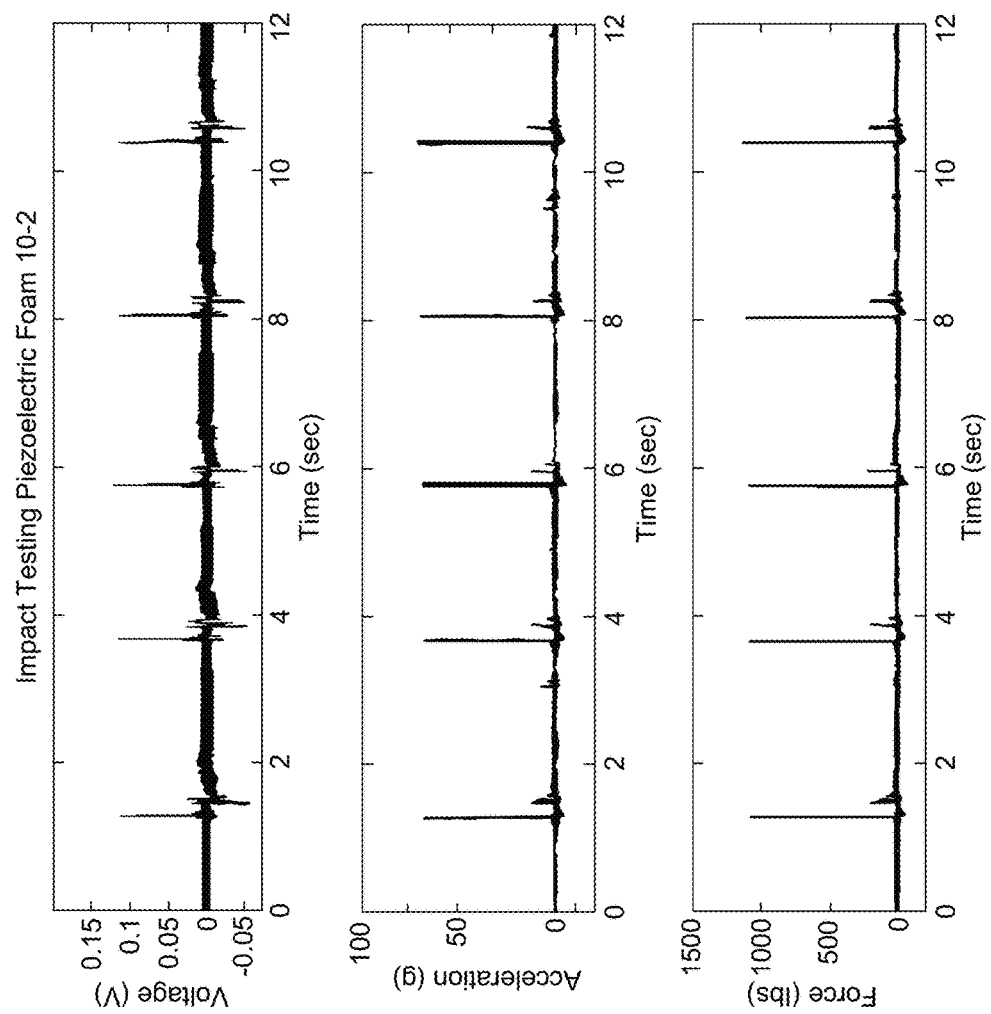
FIG. 10 is a graph illustrating the correlation between induced voltage and measured force and acceleration under impact loading for one implementation of the composite material.

FIG. 10 is a graph illustrating the results from a drop test output performed on one implementation of the composite material 200. In the example of FIG. 10 the matrix was a polyurethane foam with approximately 3% conductive stabilizers and 10% conductive nanoparticles. A sliding hammer was instrumented with an accelerometer which would impact a piece of the composite material mounted atop a load cell. FIG. 10 shows that this sample of the composite material gave a consistent voltage response to each impact as characterized by the force and acceleration measured simultaneously. It is also shown that the example composite material exhibits a second response as the hammer is removed from the foam.

Figure 11:
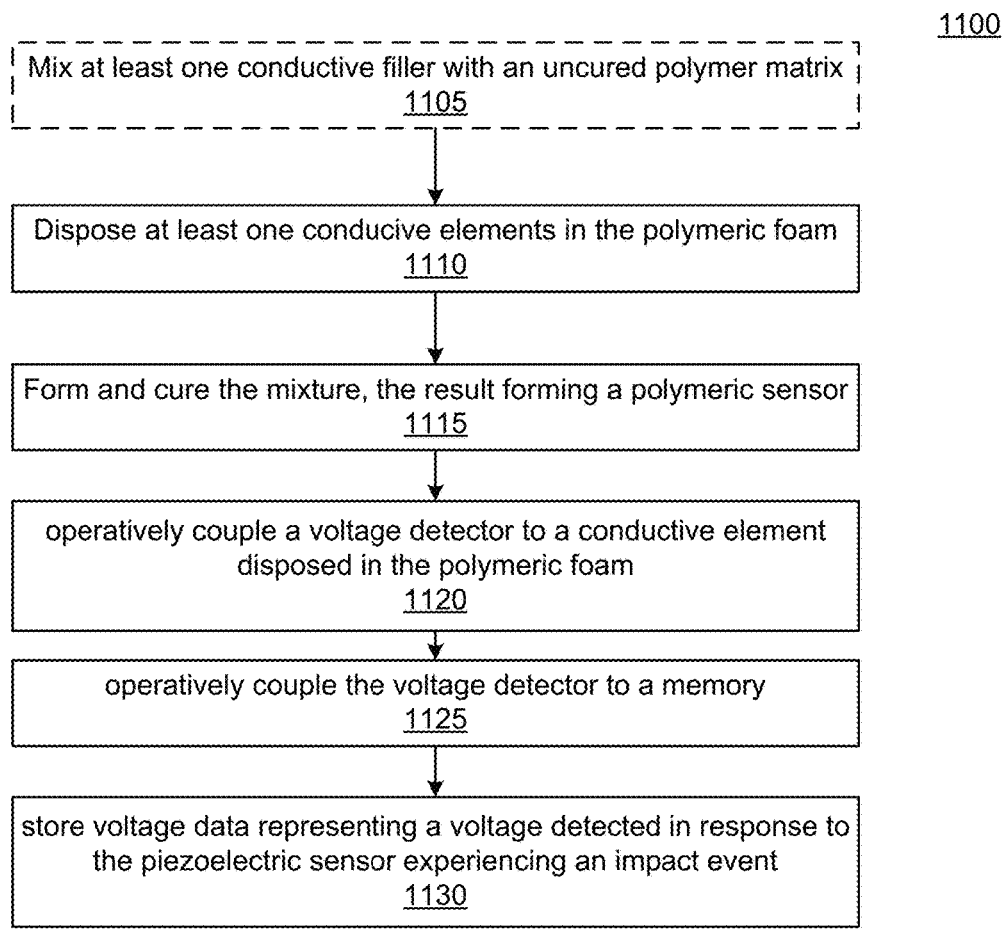
FIG. 11 is a flowchart that illustrates an example method for making a polymeric deformation gauge, according to an implementation.

FIG. 11 is a flowchart that illustrates an example method 1100 for making a polymeric deformation gauge, according to an implementation. The method 1100 produces a deformation gauge and component parts that can be used as a sensor for measuring deformations at least up to 80% strain. At 1105, optionally, at least one conductive filler is mixed with an uncured polymeric matrix. As indicated above, the conductive filler may include conductive nanoparticles and/or conductive stabilizers. The polymeric matrix can be an elastomeric polymer, a thermoset polymer, or any other polymeric foam. The ratio and amounts of conductive filler mixed with the uncured polymeric matrix depends on the desired properties of the gauge. For example, if additional energy absorption or a stiffer foam is desired, more conductive stabilizers may be mixed with the uncured polymeric foam. If increased porosity is desired, e.g., for a material with more voids, although of smaller size, more conductive nanoparticles may be mixed with the polymeric foam because the increased nanoparticles increase the nucleation points, which increases the number of voids but may end up reducing the size of the voids. As discussed herein, the amount of conductive nanoparticles can affect the porosity of the material, the formation of nano-junctions, the formation of a conductive path, etc., which can affect the voltage response of the deformation gauge.

At 1110 at least one conductive element is disposed in the polymeric foam. This may be done by placing the conductive elements in a mold prior to casting. This may also be done by inserting the conductive elements after casting and prior to curing, or even after curing. Thus, in some implementations, step 1110 may be performed as part of step 1115 or after step 1115. At step 1115, the polymeric foam is formed and cured. As part of the forming and curing, voids are formed in the polymer. Voids may be formed as a result of a chemical reaction when two component parts of the polymeric foam are mixed. Voids may also be formed as a result of dispersion of a gas or introduction of a foaming agent. The voids may be formed as part of the curing process of the polymeric foam. The amount (volume fraction of air) and size of the voids determine the porosity of the material. The porosity of the material can affect the voltage responses observed in the deformation gauge. Similarly, suitable voltage response has been observed in composite materials having voids ranging from 10 μm to 300 μm. The optimal porosity of the polymeric foam used in a piezoelectric gauge may also be dependent on the type of matrix used and the purpose of the deformation gauge. Moreover, by keeping the volume constant (e.g., by using a mold) while increasing the amount of material (e.g., by introducing more of the polymer into the mold), the size of the voids in the resulting composite material is decreased, causing a corresponding increase in Young's modulus. The modulus of the composite material can, therefore, be matched to existing foams, so that the deformation gauge may be embedded into common objects, functioning as a deformation gauge and gathering data in a normal physiological setting.

The foam may be formed, for example by casting, painting, spraying, extruding, or molding, and cured. Once formed and cured, with the conductive elements disposed therein, the resulting apparatus is capable of acting as a deformation sensor without further processing. In other words, the cured material with conductive elements disposed therein does not need to be charged or have other materials or layers added to act as a sensor. While additional components, such as a voltage detector, may be needed to detect the voltage response, the deformation gauge produces the response without additions. As indicated above, it is understood that in some implementations, steps 1115 and 1110 may be combined or reversed in order. In other words, the voids may develop while the mixture is formed and/or cured or as a result of the curing process.

At 1120 the polymeric deformation sensor, may be operatively coupled to a voltage detector. For example, the voltage detector may be coupled via one or more of the conductive elements disposed in the material. The conductive elements may be cast with the composite material or may be inserted after the composite material has cured. If the voltage detector does not include a memory, the voltage detector may also be operably coupled to a memory at 1125. The memory may store voltage data that represents a voltage detected in response to an impact or other strain-inducing event. The voltage data may include a voltage value representing a voltage detected by the voltage detector and additional information, such as a date/time, a voltage detector identifier, etc. The voltage data may be transmitted to a computing device for analysis.

Figure 12:
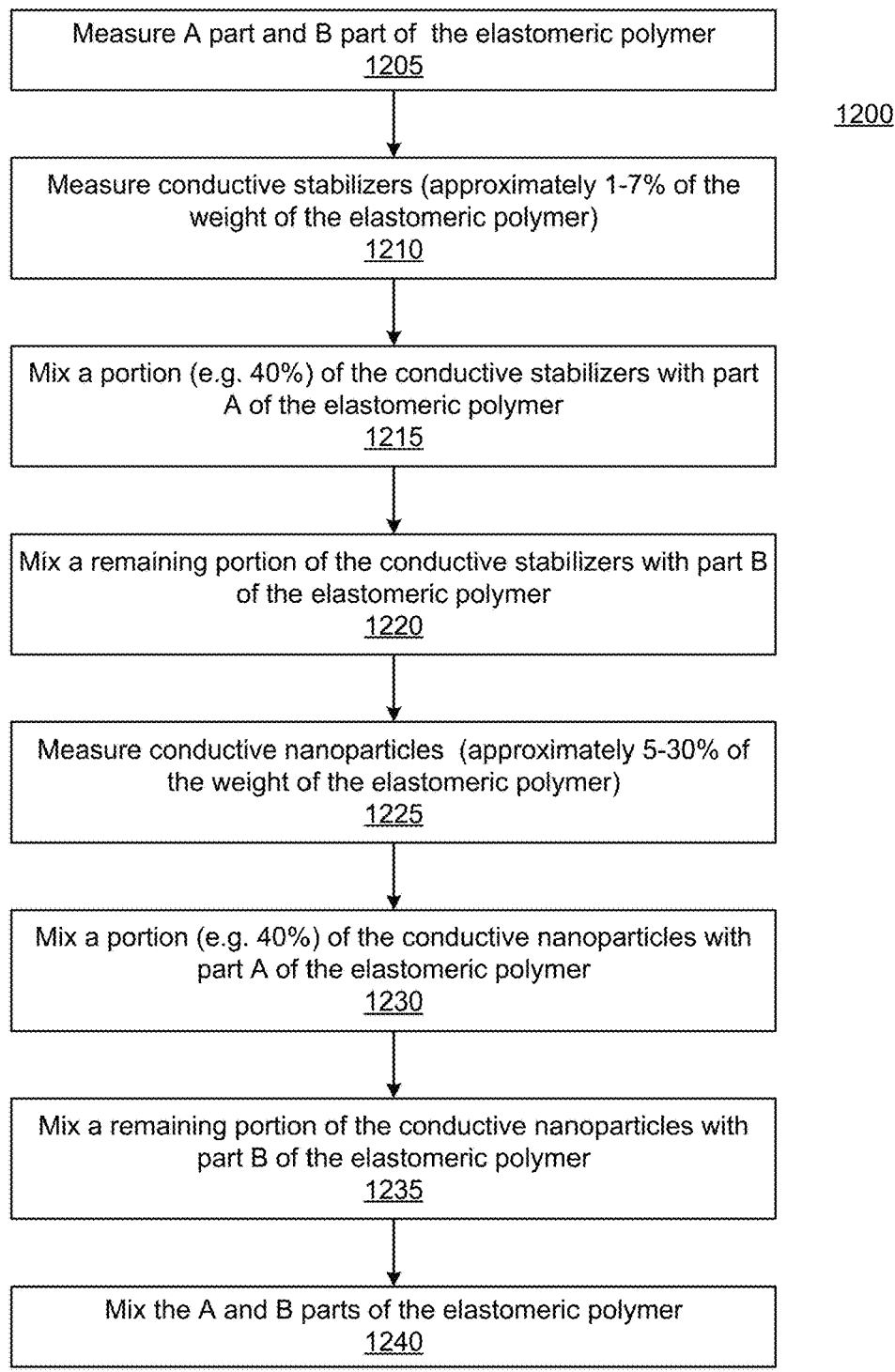
FIG. 12 is a flowchart that illustrates an example method for making a uniform composite material for use in a polymeric deformation sensor, according to an implementation.

FIG. 12 is a flowchart that illustrates an example method 1200 for making a composite material for use in a polymeric deformation sensor, according to an implementation. Process 1200 may be an example of mixing conductive fillers with the uncured polymer as part of step 1105 of FIG. 1100. In the example of process 1200, the conductive fillers include both conductive stabilizers and conductive nanoparticles and the uncured polymer includes an A part and a B part that are kept separate until formation and curing. Examples of such a polymer include, but are not limited to, silicone foams, polyurethane foams, latex foam, vinyl nitrile, etc. At 1205 the desired amounts of parts A and B of the uncured polymer are measured. At 1210 the desired amount of conductive stabilizers, e.g., nickel-coated carbon fibers, are measured. In one implementation the amount of conductive stabilizers is approximately 1 to 7% of the weight of the polymer. At 1215 a portion of the measured conductive stabilizers are added to part A of the polymer. The portion mixed with part A may be smaller than the portion mixed with part B of the polymer. In some implementations, approximately 40% of the measured amount of the conductive stabilizers are added to part A and 60% are added to part B. In some implementations, the portion mixed with part A may be related to a ratio by weight of part A and part B. In some implementations, mixing may be accomplished, for example by stirring and/or via a specialized mixer, such as a centrifugal mixer. For example, the conductive stabilizers may be mixed with part A using a glass rod and then placed in a centrifugal mixer and mixed to ensure that the conductive stabilizer is thoroughly and evenly dispersed in part A. Mixing times may be dependent upon the polymer used. For example, a silicone foam may be mixed for 10 seconds at 2000 rpm to allow time to introduce the foam into the mold, while urethane foam may be mixed for 20 seconds at 2000 rpm. The remaining portion of the conductive stabilizer may be mixed with part B of the uncured polymer at step 1220. The remaining portion may be mixed in the same manner as described with regard to step 1215.

At step 1225, the desired amount of conductive nanoparticles are measured. In some implementations, the weight of the measured conductive nanoparticles may be approximately 5 to 20% of the weight of the polymer. In some implementations, the conductive nanoparticles may be screened prior to measuring. For example, the conductive nanoparticles may be pushed through or scraped over a mesh so that the measured conductive nanoparticles do not include large clumps. At 1230, a portion of the measured conductive nanoparticles are mixed with part A of the uncured polymer and at 1235 the remaining portion is mixed with part B of the uncured polymer. In some implementations, the portion of conductive nanoparticles mixed with part A is less than the portion mixed with part B, for example 40%. As with the conductive stabilizers, the conductive nanoparticles may be mixed using a centrifugal mixer to completely and evenly disperse the nanoparticles throughout the uncured polymer.

At 1240 part A and part B of the uncured polymer may be mixed together. The parts may be mixed by stirring, by shaking, or by a specialized mixer, such as a centrifugal mixer. In some implementations, the parts may be mixed in the centrifugal mixer for 10 to 20 seconds at 2000 rpm, depending on the polymer used. Once mixed, the composite material may be formed. For example, the composite material may be cast, molded, sprayed, painted, etc., and cured. For example, the polymer may be poured into a heated mold for formation of the voids and curing. For example, in a two-part polymer, after the two parts are mixed together and poured into a mold, the polymer may rise, due to formation of voids, and harden or cure in a heated mold. A heated mold may help the foam rise and may decrease the cure time, but the mold does not necessarily need to be heated. It is understood that the method 1200 is an example method and that steps may be modified. For example, implementations may include mixing the conductive stabilizer with one part of the polymer and the conductive nanoparticles with another part of the polymer. Implementations may also include other variations.

Figure 13:
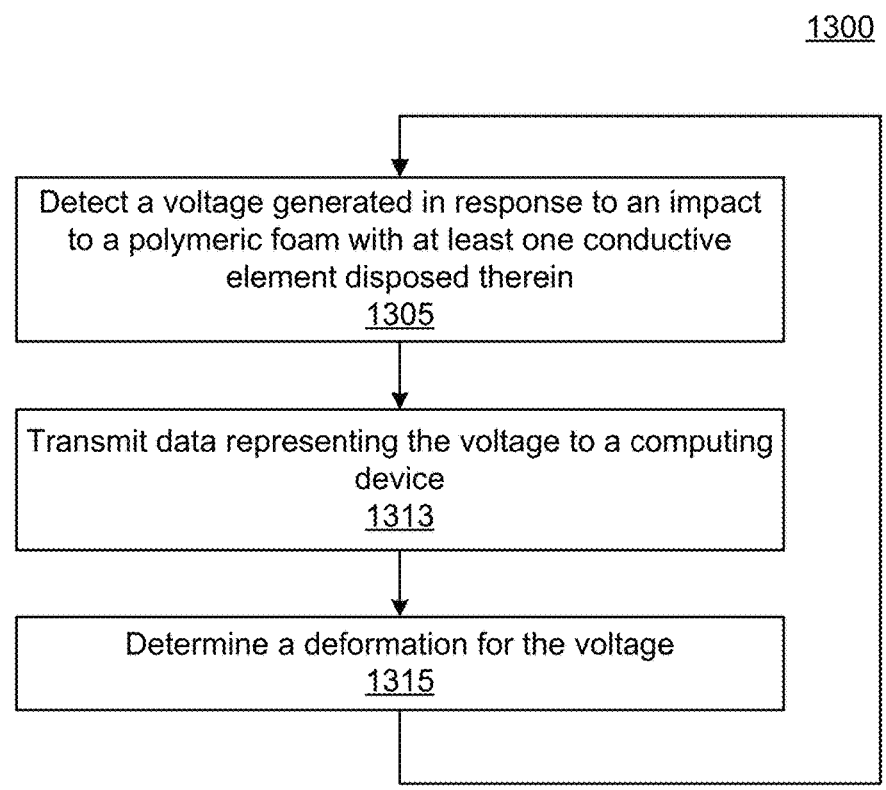
FIG. 13 is a flowchart that illustrates an example method for measuring a deformation using a polymeric deformation gauge, according to an implementation.

FIG. 13 is a flowchart that illustrates an example method 1300 for measuring a deformation using a polymeric deformation gauge, according to an implementation. The method 1300 may be performed by a system that uses the polymeric deformation gauge as a strain sensor. The polymeric deformation gauge may include a neat polymeric foam or a composite polymeric foam. At 1305, a voltage detector may detect a voltage generated in response to an impact to a polymeric foam with at least one conductive filler disposed therein. The polymeric foam may be a composite that includes conductive fillers, such as conductive nanoparticles, conductive stabilizers, or a combination of the two, as described above, at low concentrations by weight. At 1310, the apparatus may transmit data representing the voltage to a computing device. The computing device may be an external computing device and the voltage data may be transmitted wirelessly. In some implementations, the computing device may be a microcontroller. In some implementations, the transmission may be wired, for example via a Universal Serial Bus connection between an apparatus that includes the deformation sensor and a computing device. In some implementations, the data may be transmitted in response to detecting the voltage. In other words, the data may be transmitted in real-time. At 1315, the computing device may determine a deformation for the voltage. In some implementations, the deformation may represent an amount of energy absorbed. In some implementations, the deformation may represent an amplitude, an impulse, an impact energy, a strain, etc. The computing device may provide information about the deformation to a user.

Figure 14:
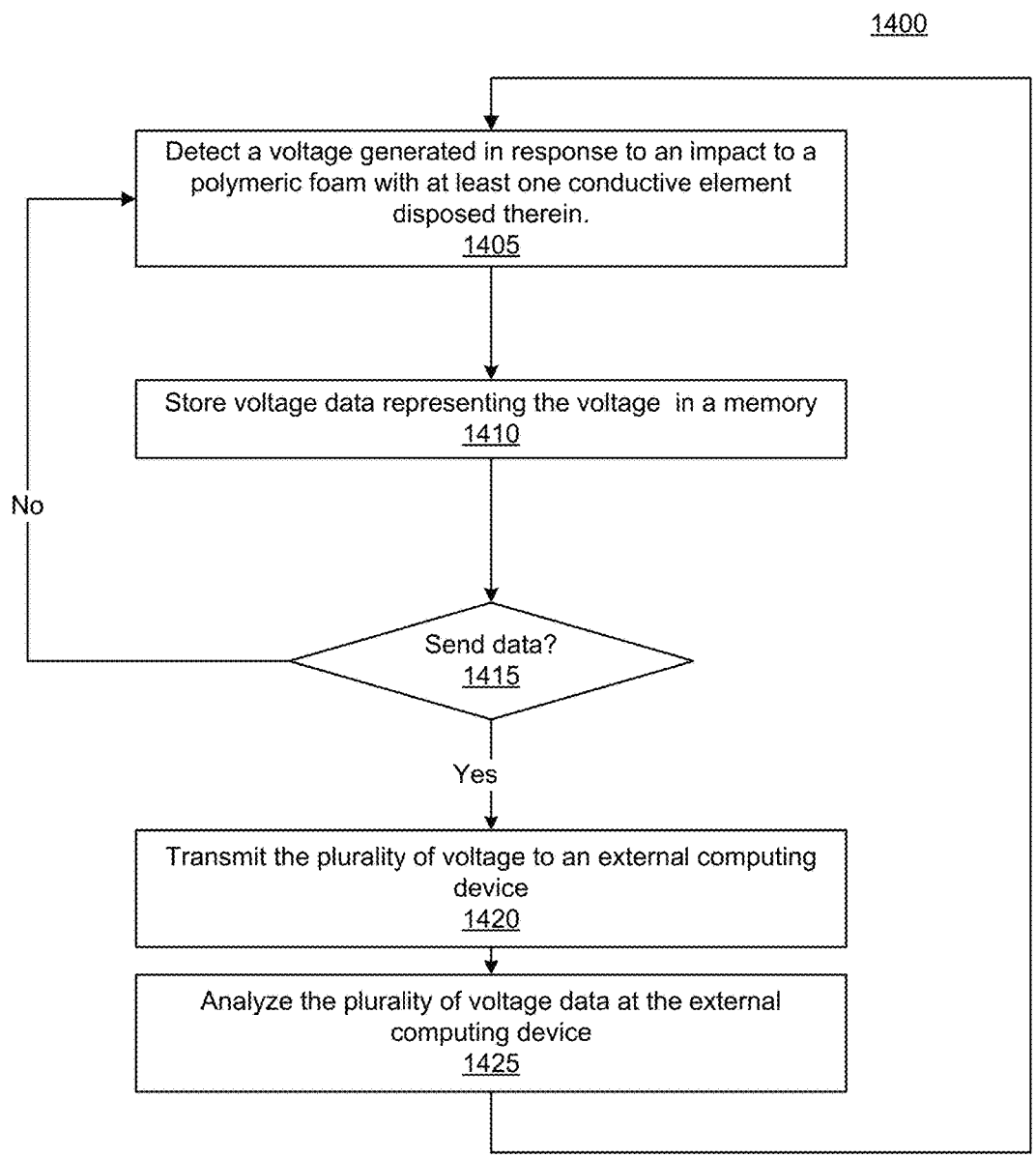
FIG. 14 is a flowchart that illustrates an example method for collecting voltage data for repeated impacts using a uniform composite material that functions as a deformation gauge, according to an implementation.

FIG. 14 is a flowchart that illustrates an example method 1400 for collecting voltage data for repeated impacts using a polymeric deformation gauge that generates a charge, according to an implementation. The method 1400 may be performed by a system that includes a composite polymeric foam or a neat polymeric foam. At 1405, a voltage detector may detect a voltage generated in response to an impact to a polymeric foam with at least one conductive element disposed therein. The polymeric foam and conductive elements are capable of generating a charge upon curing, without charging, layering, or other added components. However, the charge is enhanced when the polymeric foam is a composite polymeric foam that includes conductive fillers at a weight below 25% of the composite. In some implementations, the system may store the voltage itself for later use (e.g., by storing the voltage in a battery). The system may store voltage data representing the voltage in a memory at 1410. The data may include a value representing the voltage, a date and/or time the voltage was detected, an identifier of the voltage detector or a probe used to detect the voltage, etc.

The system may then determine whether to send the data at 1415. In some implementations, the system may send the data as soon as it is stored. In some implementations, the system may wait for a request for the data, for example a request initiated by a user or an external computing device. If the system determines the data is not to be sent (1415, No), the system may continue to monitor for impact events and store voltage data for detected events. If the system determines the data is to be sent (1415, Yes), the system may transmit the plurality of voltage data to an external computing device at 1420. In some implementations, once data is transmitted the data may be deleted from the memory. At the computing device, the system may analyze (1425) the plurality of voltage data to determine a deformation and, optionally, a strain rate, for the impact events represented by the data. The analysis may include generating graphs, charts, or reports provided to a user, for example via a display or a printer. In some implementations, the method may include providing feedback. For example, the system may initiate a sound or a light or a vibration if the voltage data meets some predetermined criteria. For example, if the voltage data indicates a concussive blow to the deformation sensor, the method may include playing a sound or causing a light to turn on. Thus, it is understood that the data may be used in a variety of ways, depending on the type product the deformation gauge is used in. For example, the data may be used in gait analysis, orthotic customization, injury assessment, grip analysis, touch feedback, motion movement analysis, early-warning crash detection (e.g., a car bumper), weight sensitive switching (e.g., a weight sensitive material for enabling or disabling automotive airbags), The sensor can also be embedded into the car's dash and door pads to enable impact detection for first responders assessment of accidents. It is also understood that in some implementations, the analysis and feedback may be provided without transmission of the data to an external computing device. For example, a voltage detector may include programming and hardware that is capable of performing the analysis and audio/visual feedback.

Figure 15A:
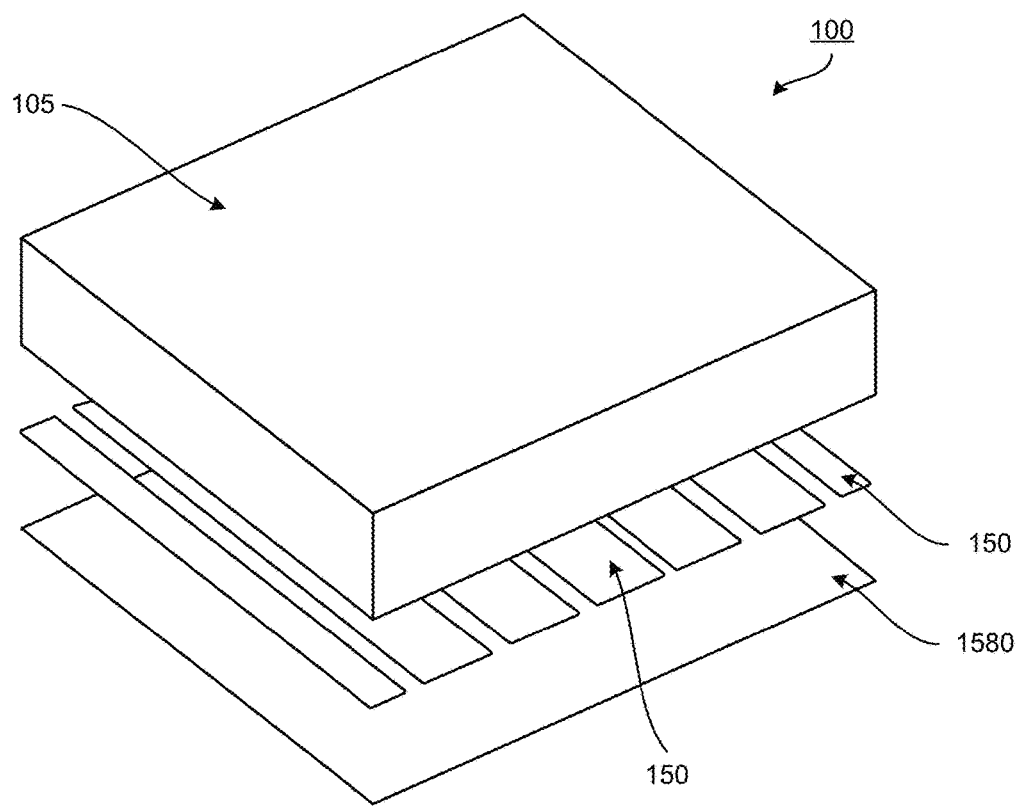
FIGS. 15A to 15C are schematic diagrams of other example polymeric deformation gauges with conductive elements that generates as well as conducts charge, according to an implementation.

FIG. 15A is a high-level schematic diagram of an example deformation gauge 100 that includes polymeric foam 105 (e.g., a neat foam or a composite foam), that has conductive elements connected to an outside wall of the polymeric foam 105 to create a voltage sensing network. In the example of FIG. 15A, the conductive elements 150 may be painted, printed, or glued on a substrate 1580. The substrate 1580 may be a film, or fabric, or another foam. The substrate 1580 may be an insulator. The polymeric foam 105 may be cast atop the conductive elements 150 so that the conductive elements 150 are disposed between the substrate and the polymeric foam 105. In some implementations, the polymeric foam may be cast or printed via a screening process, so that the polymeric foam forms a pattern. The polymeric foam may cure (or rise) in-place after being printed atop the conductive elements. The conductive elements may be connected to a voltage sensor, either directly (e.g., a portion of the conductive element extends beyond the polymeric foam 105), or via a trace. After curing, the polymeric foam 105 forms connection points or electrical contacts with the conductive elements 150. Thus, the polymeric foam 105 is in contact with the conductive elements 150. When an impact event occurs a charge may be generated by interaction between the polymeric foam and the conductive elements 150. The charge generated is a function of the surface area of the conductive elements 150 in contact with the polymeric foam 150, as described above. Each of the conductive elements 150 may have a sensing radius that extends beyond the edge of the conductive element 150. The conductive elements 150 may be printed on the substrate in a pattern that allows the sensing radii of adjacent conductive elements 150 to overlap.

Figure 15B:
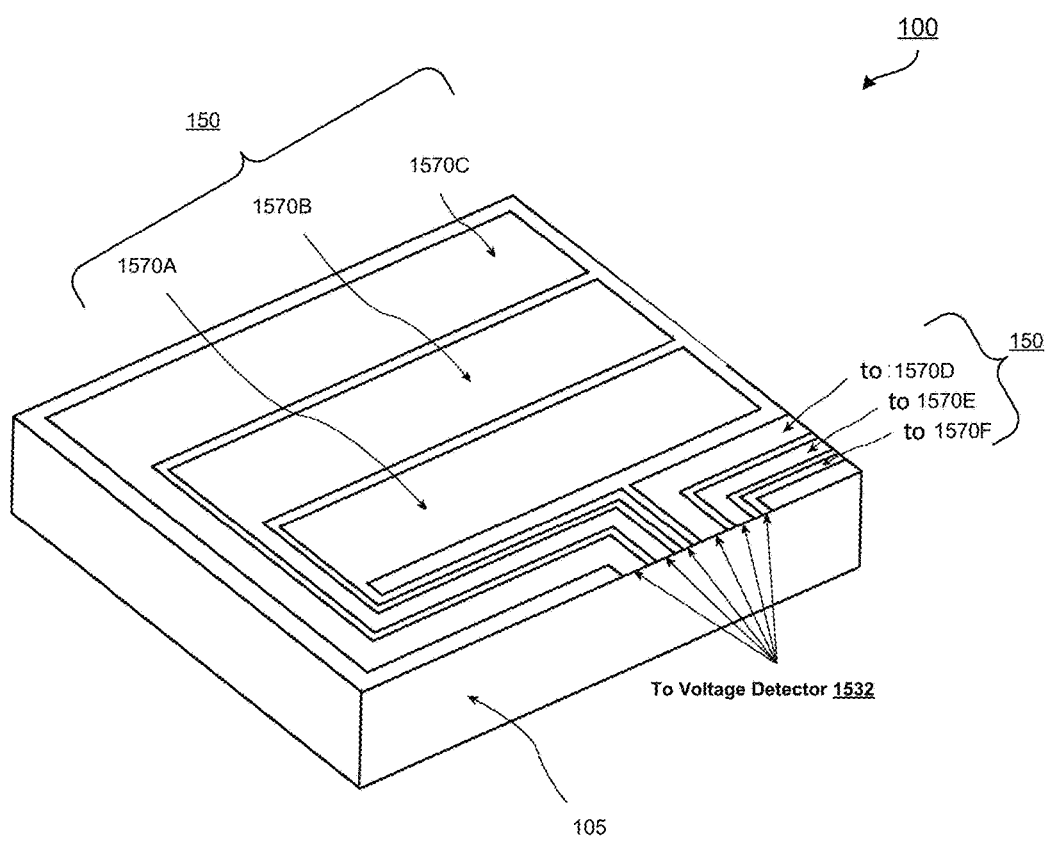

FIG. 15B is a high-level schematic diagram of an example deformation gauge 100 that includes a polymeric foam 105 (e.g., a neat foam or a composite foam as described above with regard to FIG. 2A to 2E) that has conductive elements 150 connected to or disposed on an outside wall of the polymeric foam 105 to create a voltage sensing network. The conductive elements 150 may be painted or printed on an outside surface of the composite polymeric foam 105. The conductive elements 150 of the deformation gauge 100 may form circuitry printed on the polymeric foam 105 after the foam 105 is cured. For example, in some implementations the composite polymeric foam 105 may be cast in a large foam billet that can later be skived down to the desired thickness and cut to the desired length, which removes the foam skin. This prepares the polymeric foam 105 to receive conductive paint or print, which form conductive elements 150. The absence of foam skin enables the polymeric foam 105 to make more electrical contacts than would be present when the foam has a skin. In other implementations the foam can be cast to thickness with the conductive elements cast in the foam to keep the outer skin when desired (e.g., as described above).

In the example of FIG. 15B, the deformation gauge 100 includes a plurality of sensor pads 1570 (e.g., 1570A, 1570B, etc.) that form a network with multiple sensing locations, Each sensor pad 1570 is an example of a conductive element 150 deposited on the outer wall of the polymeric foam 105. Each sensor pad 1570 includes a trace (e.g., a path from the sensor pad) with all traces returning to one central location for connection to a voltage detector 1532, which is an example of voltage detector 432 of FIG. 4. FIG. 15B also shows that the sensor pads farther from the voltage detector 1532, e.g., 170C, may require a wider trace to lower the resistance and so that the sensor pad provides a similar response to impact as those closer to the voltage sensing device, e.g., 1570A. This could also be accounted for with a scaling of the voltage or inline resistors prior to connection with the voltage detector 1532. In the example of FIG. 15B the deformation gauge 100 is partially shown because the sensor pads 1570D, 1570E, and 1570F are not illustrated, but the traces for these sensor pads are illustrated. The pattern that is shown in FIG. 15B is an example of one implementation, but more complex patterns could be created.

Figure 15C:
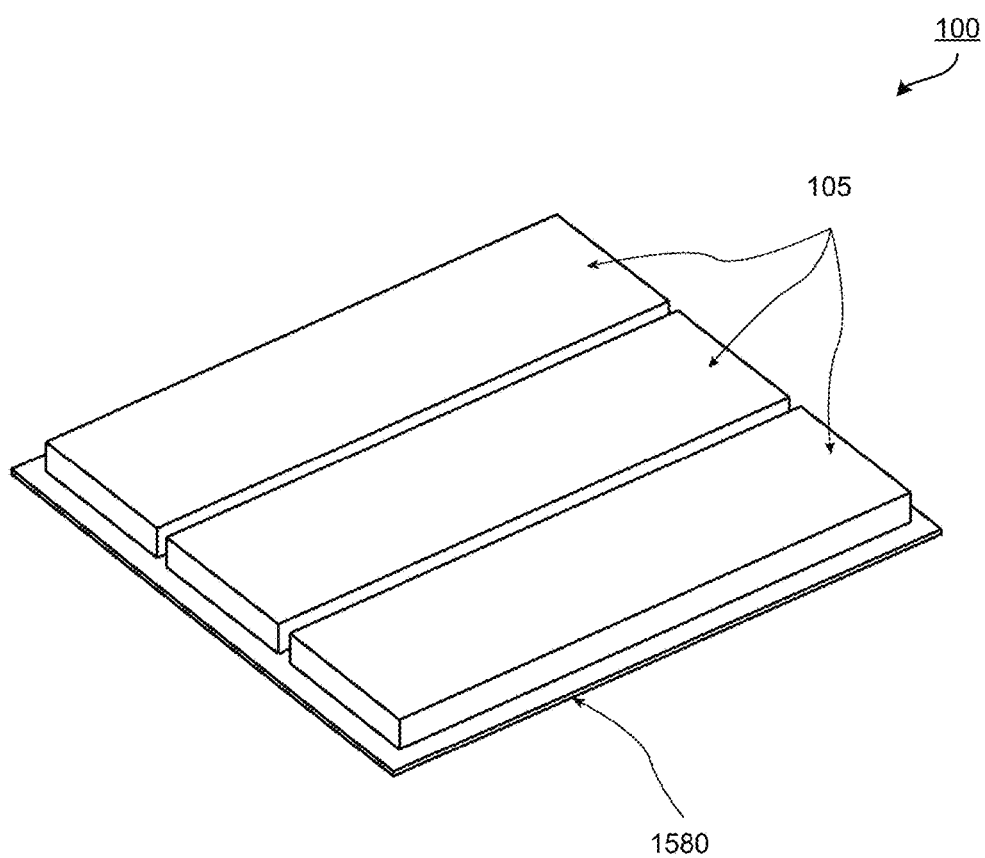

FIG. 15C is a high-level schematic diagram of another example deformation gauge 100 that includes a polymeric foam 105 with conductive elements 150 attached to an outside wall of the polymeric foam 105. The example of FIG. 15C may be similar to FIG. 15A in that the polymeric foam is cast onto one or more conductive elements 150 that have been attached to a substrate 1580, but in the example of FIG. 15C, the polymeric foam 105 separated into three portions. In some implementations, the portions may each correspond to a single conductive element 150 (not shown). The arrangement of the polymeric foam 105 of deformation gauge 100 illustrates an example pattern that the polymeric foam 105 may take when applied to the conductive elements. Of course, implementations are not limited to the pattern illustrated.

Figure 16:
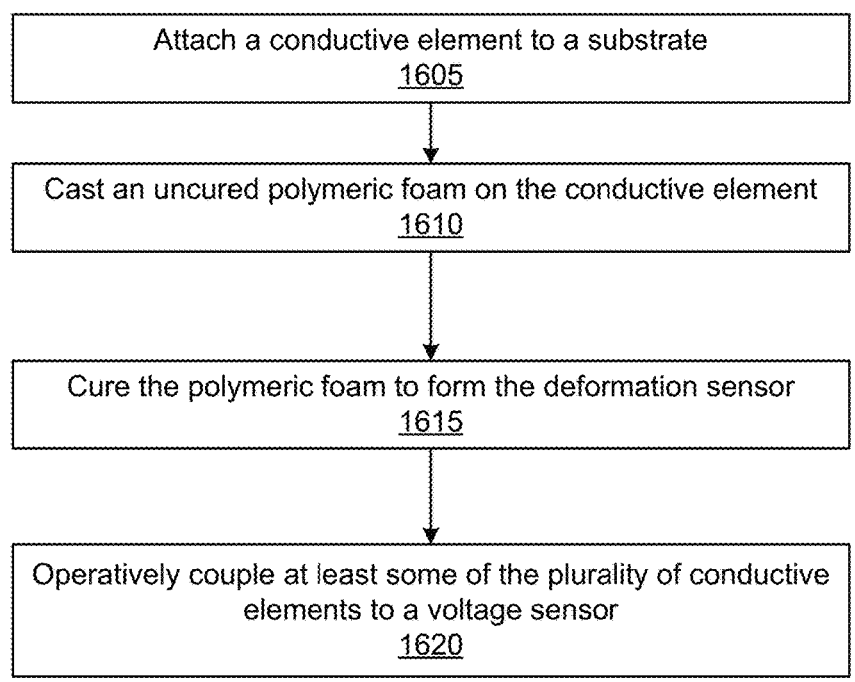
FIG. 16 is a flowchart that illustrates an example method 1600 for making a deformation strain gauge, according to an implementation.

FIG. 16 is a flowchart that illustrates an example process 1600 for making a deformation strain gauge, according to an implementation. Process 1600 may be an example of attaching at least one conductive element to the polymeric foam as described above with regard to FIGS. 15A and 15C. In the example of process 1600, one or more conductive elements are attached to a substrate (1605). The conductive elements may be printed onto the substrate or painted on the substrate. At 1610 the uncured polymeric foam (e.g., a neat foam or a composite foam), is cast on the conductive elements. The polymeric foam can be, for example, printed, sprayed, or painted on the conductive elements. In some implementations, the casting may be done with a template, screening process, or 3D printer to create a pattern atop the substrate. Because the polymeric foam is cast onto the conductive elements, the conductive elements are attached to an outer wall of the polymeric foam. At 1615 the polymeric foam is cured. The curing process may allow the polymeric foam to rise and harden. The polymeric foam, conductive element(s) and substrate form the deformation sensor. At 1620 at least some of the conductive elements are operably coupled to a voltage sensor. In some implementations, each conductive element may be coupled to a separate voltage sensor. The voltage sensor is an example of the voltage sensor described with regard to the voltage sensor 432 of FIG. 4. In some implementations, the conductive elements are coupled to a single voltage sensor. The voltage sensor may detect the charge generated when the polymeric foam experiences an impact.

Figure 17:
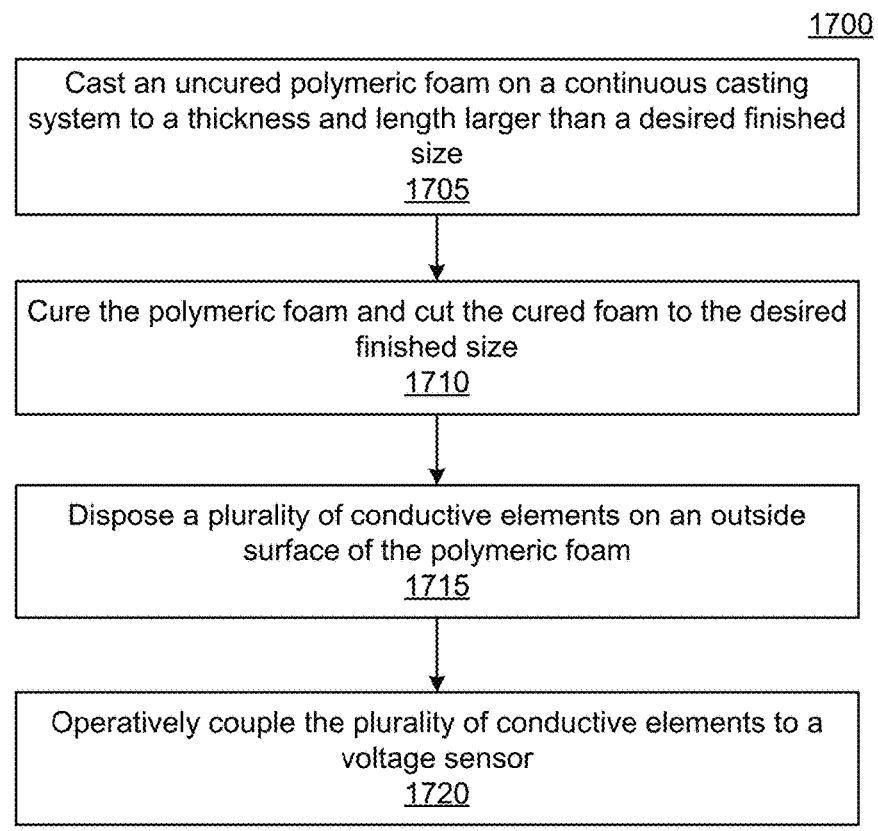
FIG. 17 is a flowchart that illustrates an example method 1700 for making a deformation strain gauge, according to an implementation.

FIG. 17 is a flowchart that illustrates an example process 1700 for making a deformation strain gauge, according to an implementation. Process 1700 may be an example of attaching at least one conductive element to the polymeric foam as described above with regard to FIG. 15B. In the example of process 1700, the uncured polymeric foam (e.g., neat foam or composite foam) is cast on a continuous casting system to a thickness and length larger than a desired finished size (1705). For example, the uncured polymeric foam may be cast on a conveyer-belt type system. At 1710 the polymeric foam may be cured and then cut to the desired finished size. Cutting the polymeric foam to the desired size may include skiving the foam to a desired thickness. This may remove the skin, which may enable the foam to have more contact points with the conductive elements. Cutting the polymeric foam may also include cutting the foam to a desired length and/or width. Cutting also includes cutting the foam into any shape. At 1715, a plurality of conductive elements are disposed on an outside surface of the polymeric foam. As indicated above, removing the skin of the foam prior to applying the conductive elements to the foam increases the electrical contacts between the conductive elements and the foam, which increases the sensitivity of the deformation gauge. The conductive elements may be printed or painted onto the outer wall of the polymeric foam. The conductive elements may be formed as a sensing area, e.g., sensing area 1570 of FIG. 15B. At 1720 at least some of the conductive elements are operatively coupled to a voltage sensor (or sensors).

Referring back to FIG. 4, in some implementations, the system 400 and computing device 450 can be, for example, a wired device and/or a wireless device (e.g., Wi-Fi, ZigBee or BLUETOOTH enabled device) and can be, for example, a computing entity (e.g., a personal computing device), a server device (e.g., a web server), a mobile phone, a touchscreen device, a personal digital assistant (PDA), a laptop, a television including, or associated with, one or more processors, a tablet device, an e-reader, and/or so forth. The computing device 450 can be configured to operate based on one or more platforms (e.g., one or more similar or different platforms) that can include one or more types of hardware, software, firmware, operating systems, runtime libraries, and/or so forth.

The components (e.g., modules, processors) of the computing device 450 can be configured to operate based on one or more platforms (e.g., one or more similar or different platforms) that can include one or more types of hardware, software, firmware, operating systems, runtime libraries, and/or so forth. In some implementations, the components of the computing device 450 can be configured to operate within a cluster of devices (e.g., a server farm). In such an implementation, the functionality and processing of the components of the computing device 450 can be distributed to several devices of the cluster of devices.

The components of the computing device 450 (e.g., the compression impact analysis module 455 of the computing device 450) can be, or can include, any type of hardware and/or software configured to analyze voltage data. For example, in some implementations, one or more portions of the compression impact analysis module 455 in FIG. 4 can be, or can include, a hardware-based module (e.g., a digital signal processor (DSP), a field programmable gate array (FPGA), a memory), a firmware module, and/or a software-based module (e.g., a module of computer code, a set of computer-readable instructions that can be executed at a computer). For example, in some implementations, one or more portions of the components of the computing device 450 can be, or can include, a software module configured for execution by at least one processor (not shown). In some implementations, the functionality of the components can be included in different modules and/or different components than those shown in FIG. 4.

In some embodiments, one or more of the components of the computing device 450 can be, or can include, processors configured to process instructions stored in a memory. For example, the compression impact analysis module 455 (and/or portions thereof) can be, or can include, a combination of a processor and a memory configured to execute instructions related to a process to implement one or more functions.

Although not shown, in some implementations, the components of the computing device 450, such as the compression impact analysis module 455 of the computing device 450, can be configured to operate within, for example, a data center, a cloud computing environment, a computer system, one or more server/host devices, and/or so forth. In some implementations, the components of the computing device 450 can be configured to operate within a network. Thus, the components of the computing device 450 or apparatus 410 can be configured to function within various types of network environments that can include one or more devices and/or one or more server devices. For example, the network can be, or can include, a local area network (LAN), a wide area network (WAN), and/or so forth. The network can be, or can include, a wireless network and/or wireless network implemented using, for example, gateway devices, bridges, switches, and/or so forth. The network can include one or more segments and/or can have portions based on various protocols such as Internet Protocol (IP) and/or a proprietary protocol. The network can include at least a portion of the Internet.

In some implementations, the memory 434 and/or the memory 458 can be any type of memory such as a random-access memory, a disk drive memory, flash memory, and/or so forth. In some implementations, the memory 434 and/or the memory 458 can be implemented as more than one memory component (e.g., more than one RAM component or disk drive memory) associated with the components of the apparatus 410 or the computing device 450. In some embodiments, the calibration data 452 or the memory 458 (or a portion thereof) can be a remote database, a local database, a distributed database, a relational database, a hierarchical database, and/or so forth. As shown in FIG. 4, at least some portions of the calibration data 452 and/or transmitted voltage data can be stored in the memory 458 (e.g., local memory, remote memory) of the computing device 450. In some embodiments, the memory 458 can be, or can include, a memory shared by multiple devices such as computing device 450. In some implementations, the memory 458 can be associated with a server device (not shown) within a network and configured to serve the components of the computing device 450.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device (computer-readable medium) or in a propagated signal, for processing by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be processed on one computer or on multiple computers at one site or distributed across multiple sites and interconnected by a communication network.

Many of the method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the processing of a computer program include, by way of example, both general and special purpose microprocessors, and any one or more processors formed in a substrate of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT), liquid crystal display (LCD) monitor, or a touch screen for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

In one aspect, an apparatus includes a deformation sensor and a voltage detector. The deformation sensor includes a conductive elements disposed in a polymeric foam, a portion of the conductive element extending beyond an outer wall of the polymeric foam. The voltage detector is coupled to the portion of the conductive element that extends beyond the outer wall and detects a charge generated by the deformation sensor responsive to an impact to the polymeric foam.

These and other aspects may include one or more of the following features, alone or in combination. For example, the polymeric foam may be a composite foam that includes conductive fillers. As another example, the system may include a voltage collector that stores the charge generated by the deformation sensor. As another example, the conductive element may be copper wire, a wire coil, conductively coated film, conductive paint, and/or conductive ink. As another example, the charge generated may be a function of the surface area of the conductive element that is disposed in the polymeric foam. As another example, the system may also include a wireless controller operably coupled to the voltage detector and a computing device operably coupled to the wireless controller, the computing device configured to analyze data collected by the voltage detector. As another example, the impact generates the charge via a triboelectric effect.

In another aspect, an apparatus includes at least two conductive elements disposed in a polymeric foam and at least two voltage detectors. Each voltage detector is coupled to a respective conductive element and configured to detect a charge generated by an impact to the polymeric foam within a sensing radius of the respective conductive element.

These and other aspects may include one or more of the following features. For example, the polymeric foam may be a composite foam that includes conductive fillers, the conductive fillers being up to 25 percent by weight of the composite foam. As another example, the apparatus may also include a memory communicatively coupled to the at least two voltage detectors, the memory configured to store voltage data collected by the at least two voltage detectors. As another example, the apparatus may include a compression impact analysis module communicatively coupled to the at least two voltage detectors, the compression impact analysis module configured to use voltage data from at least two voltage detectors to determine a location of the impact. As another example the at least two conductive elements may be adjacently spaced in the polymeric foam so that the sensing radii overlap. As another example, each voltage detector may be coupled to a portion of the respective conductive element that extends beyond an outer wall of the polymeric foam. As another example, the conductive elements may include a wire that enters an outer wall of the polymeric foam and is splayed. As another example, the apparatus may function as padding in a consumer apparatus.

In another aspect, a method for measuring compression strain includes detecting, along a first axis, a charge generated in response to an impact to a polymeric foam having at least one conductive element disposed therein, the impact being along a second axis different from the first axis and determining a deformation of the impact based on the charge.

These and other aspects may include one or more of the following features, alone or in combination. For example, the polymeric foam may measure up to 80% strain without permanent deformation of the foam. As another example, the polymeric foam may measure up to 90% strain while suffering from permanent deformation of the foam. As another example, the portion that extends beyond the outer wall may be a trace. As another example, the polymeric foam may have at least two conductive elements disposed therein and the charge is a first charge. The method may further include detecting, along a third axis different from the first axis and the second axis, a second charge generated by the impact and determining a location of the impact based on the first charge and the second charge. As another example, the charge may be substantially the same after repeated detecting and determining. As another example, the charge generated may be a function of the surface area of the at least one conductive element disposed therein. As another example, the method may also include determining a strain rate and deformation for the impact based on the charge generated. As another example, the polymeric foam may be a uniform composite foam that includes conductive fillers. As another example, the polymeric foam is part of a wearable device and the method further comprises using the charge generated to extend battery life of the wearable device. As another example, the method may also include transmitting data representing the charge to an external computing device and determining the deformation of the impact at the external computing device. As another example, the charge generated decreases with increasing distance of the impact from the at least one conductive element. As another example, the method may also include providing auditory or visual feedback when the deformation meets a threshold.

In another aspect, a method of making a deformation sensor includes attaching a conductive element on a substrate, casting an uncured polymeric foam on the conductive element, and curing the polymeric foam to form the deformation sensor, the deformation sensor producing a voltage in response to compression. In some implementations, the substrate may be a film or fabric or a second cured foam.

These and other aspects may include one or more of the following features. For example, the method may also include coupling a voltage detector to at least one of the conductive elements. The method may also include communicatively coupling a compression impact analysis module to the voltage detector. As another example, the method occurs outside of a cleanroom.

In another aspect a method of making a deformation sensor includes casting an uncured polymeric foam on a continuous casting system to a size larger than the final product, cutting the foam to the desired size, disposing a conductive element on an outside surface of the cured polymeric foam, and connecting the conductive element to a voltage detector.

These and other aspects may include one or more of the following features. For example, the size may be a desired thickness. As another example cutting the foam removes a skin of the foam. As another example, disposing the conductive element on the outside surface can include painting the conductive element on the outside surface and/or or printing the conductive element on the outside surface.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a deformation sensor that includes at least two conductive elements disposed in a polymeric foam, a portion of each of the at least two conductive elements extending beyond an outer wall of the polymeric foam; and
a voltage detector coupled to the at least two conductive elements for detecting a charge generated by the deformation sensor in response to an impact to the polymeric foam within a sensing radius of the respective conductive element, wherein a charge generated by an impact to the polymeric foam is a function of the surface area of the conductive element that is disposed in the polymeric foam, and wherein the at least two conductive elements are adjacently spaced in the polymeric foam so that the respective sensing radii of the at least two conductive elements overlap.

2. The apparatus of claim 1, wherein the polymeric foam is a composite foam that includes conductive fillers.

3. The apparatus of claim 1, further comprising a voltage collector that stores the charge generated by the deformation sensor.

4. The apparatus of claim 1, wherein at least one of the at least two conductive elements is copper wire.

5. The apparatus of claim 1, wherein at least one of the at least two conductive elements is a wire coil.

6. The apparatus of claim 1, wherein at least one of the at least two conductive elements includes conductively coated film.

7. The apparatus of claim 1, further comprising:
a wireless controller operably coupled to the voltage detector; and
a computing device operably coupled to the wireless controller, the computing device configured to analyze data collected by the voltage detector.

8. The apparatus of claim 1, wherein the impact generates the charge via a triboelectric effect.

9. An apparatus, comprising:
at least two conductive elements disposed in a polymeric foam; and
at least two voltage detectors, each voltage detector being coupled to a respective conductive element, the voltage detector configured to detect a charge generated by an impact to the polymeric foam within a sensing radius of the respective conductive element, wherein the at least two conductive elements are adjacently spaced in the polymeric foam so that the sensing radii overlap.

10. The apparatus of claim 9, wherein the polymeric foam is a composite foam that includes conductive fillers, the conductive fillers being up to 25 percent by weight of the composite foam.

11. The apparatus of claim 9, further comprising:
a memory communicatively coupled to the at least two voltage detectors, the memory configured to store voltage data collected by the at least two voltage detectors.

12. The apparatus of claim 9, further comprising:
a compression impact analysis module stored on a non-transitory computer readable medium and communicatively coupled to the at least two voltage detectors, the compression impact analysis module configured to use voltage data from at least two voltage detectors to determine a location of the impact.

13. The apparatus of claim 9, wherein each voltage detector is coupled to a portion of the respective conductive element that extends beyond an outer wall of the polymeric foam.

14. The apparatus of claim 9, wherein the conductive elements include a wire that enters an outer wall of the polymeric foam and is splayed.

15. The apparatus of claim 9, wherein the apparatus functions as padding in a consumer apparatus.

16. A method for measuring compression strain, the method comprising:
detecting, along a first axis, a charge generated in response to an impact to a polymeric foam having at least one conductive element disposed therein, the impact being along a second axis different from the first axis; and
determining a deformation of the impact based on the charge, the polymeric foam measuring up to 80% strain without permanent deformation of the foam.

17. The method of claim 16, wherein the conductive element has a sensing radius and the impact occurs within the sensing radius.

18. The method of claim 16, wherein the polymeric foam has at least two conductive elements disposed therein and the charge is a first charge and the method further comprises:
detecting, along a third axis different from the first axis and the second axis, a second charge generated by the impact; and
determining a location of the impact based on the first charge and the second charge.

19. The method of claim 16, wherein the charge generated is a function of the surface area of the at least one conductive element disposed therein.

20. The method of claim 16, further comprising determining a strain rate and deformation for the impact based on the charge generated.

21. The method of claim 16, wherein the polymeric foam is a uniform composite foam that includes conductive fillers.

22. The method of claim 16, wherein the polymeric foam is part of a wearable device and the method further comprises using the charge generated to extend battery life of the wearable device.

23. The method of claim 16, wherein the charge generated decreases with increasing distance of the impact from the conductive element.

24. The method of claim 16, further comprising providing auditory or visual feedback when the deformation meets a threshold.

25. An apparatus, comprising:
a deformation sensor that includes a conductive element disposed on a polymeric foam, the conductive element including conductive ink or conductive paint; and
a voltage detector, coupled to the conductive element, for detecting a charge generated by the deformation sensor responsive to an impact within a sensing radius of the conductive element.

26. The apparatus of claim 25, wherein the conductive element is one of a plurality of conductive elements and the plurality of conductive elements form circuitry.

27. The apparatus of claim 25, wherein the conductive element is one of a plurality of conductive elements and the plurality of conductive elements are disposed on the polymeric foam in a pattern that enables sensing radii of adjacent conductive elements to overlap.

28. The apparatus of claim 25, wherein the polymeric foam is a composite foam that includes conductive fillers.

29. The apparatus of claim 25, wherein the conductive element is a first conductive element of a plurality of conductive elements, each of the plurality of conductive elements being coupled to the voltage detector via a respective trace, wherein the first conductive element is closer to the voltage detector than a second conductive element of the plurality of conductive elements, and a trace for the second conductive element has lower voltage response than a trace of the first conductive element.

30. The apparatus of claim 25, wherein the deformation sensor generates the charge without a current producing device.

* * * * *